US 11,133,186 B2

(12) United States Patent
Kitahara

(10) Patent No.: US 11,133,186 B2
(45) Date of Patent: Sep. 28, 2021

(54) PROCESSING METHOD OF WORKPIECE

(71) Applicant: DISCO CORPORATION, Tokyo (JP)

(72) Inventor: Nobuyasu Kitahara, Tokyo (JP)

(73) Assignee: DISCO CORPORATION, Tokyo (JP)

( * ) Notice: Subject to any disclaimer, the term of this patent is extended or adjusted under 35 U.S.C. 154(b) by 0 days.

(21) Appl. No.: 16/256,647

(22) Filed: Jan. 24, 2019

(65) Prior Publication Data

US 2020/0090934 A1 Mar. 19, 2020

Related U.S. Application Data

(60) Provisional application No. 62/731,379, filed on Sep. 14, 2018.

(51) Int. Cl.
*H01L 21/033* (2006.01)
*H01L 21/02* (2006.01)
*H01L 21/027* (2006.01)
*H01L 21/67* (2006.01)
*H01L 21/683* (2006.01)

(52) U.S. Cl.
CPC .... *H01L 21/0337* (2013.01); *H01L 21/02057* (2013.01); *H01L 21/0275* (2013.01); *H01L 21/6704* (2013.01); *H01L 21/67075* (2013.01); *H01L 21/6833* (2013.01); *H01L 21/6836* (2013.01)

(58) Field of Classification Search
CPC ......... H01L 21/30; H01L 21/78; H01L 21/00; B05D 1/02; C23F 1/02
USPC .......................................................... 438/73
See application file for complete search history.

(56) References Cited

U.S. PATENT DOCUMENTS

| 6,352,747 | B1* | 3/2002 | Blackburn | G02B 1/10 427/425 |
| 9,601,706 | B2* | 3/2017 | Iwai | H01L 21/02118 |
| 2002/0168793 | A1* | 11/2002 | Izumi | G02F 1/13336 438/73 |
| 2003/0017686 | A1* | 1/2003 | Wada | H01L 21/31111 438/586 |
| 2005/0106840 | A1* | 5/2005 | Arai | H01L 21/304 438/459 |
| 2006/0105544 | A1* | 5/2006 | Takanashi | C09D 5/32 438/460 |
| 2011/0171834 | A1* | 7/2011 | Yaguchi | C09K 13/02 438/753 |
| 2012/0067843 | A1* | 3/2012 | Watanabe | H01L 21/0337 216/22 |
| 2013/0105859 | A1* | 5/2013 | Wang | H01L 29/78 257/190 |

(Continued)

FOREIGN PATENT DOCUMENTS

JP 2003320466 A 11/2003
JP 2006014031 A 1/2006

*Primary Examiner* — Dah-Wei D. Yuan
*Assistant Examiner* — Andrew J Bowman
(74) *Attorney, Agent, or Firm* — Greer Burns & Crain Ltd.

(57) ABSTRACT

There is provided a processing method of a workpiece. In the processing method, a protective film including a water-insoluble resin is formed on the front surface of a workpiece and the workpiece on which the protective film is formed is processed. Furthermore, the protective film is deteriorated by supplying an organic solvent to the workpiece processed and the protective film is removed from the front surface of the workpiece by supplying cleaning water to the protective film deteriorated.

20 Claims, 14 Drawing Sheets

(56) References Cited

U.S. PATENT DOCUMENTS

2015/0111383 A1* 4/2015 Miura .................. B24B 37/044
438/693

* cited by examiner

PROCESSING METHOD OF WORKPIECE

BACKGROUND OF THE INVENTION

Field of the Invention

The present invention relates to a processing method of a workpiece used when a plate-shaped workpiece typified by a wafer is processed.

Description of the Related Art

In electronic equipment typified by mobile phones and personal computers, a device chip including a device such as an electronic circuit is an essential constituent element. The device chip is obtained by segmenting the front surface side of a wafer composed of a semiconductor material such as silicon into plural regions by planned dividing lines (streets) and forming a device in each region and thereafter dividing the wafer along these planned dividing lines, for example.

When a plate-shaped workpiece typified by a wafer is divided, for example, a processing method called laser ablation is used (refer to Japanese Patent Laid-open No. 2003-320466, for example). In this laser ablation, part of the workpiece is melted and sublimated by a laser beam and therefore processing dust called debris or the like is readily generated.

If the debris generated in the laser ablation gets contact with and adheres to the workpiece, it becomes impossible to easily remove this debris from the workpiece. Therefore, the front surface side of the workpiece is covered by a water-soluble protective film in advance to prevent the debris from getting contact with the workpiece (refer to Japanese Patent Laid-open No. 2006-14031, for example).

SUMMARY OF THE INVENTION

Incidentally, when a workpiece is processed by laser ablation or the like, processing distortion (heat distortion) occurs in the processed region of the workpiece and the flexural strength of a device chip lowers. Accordingly, studies are being made on removing the processing distortion from the workpiece by using a method called etching (wet etching) in which the processed region is treated with a chemical (etchant).

In this etching, it is conceivable that the above-described water-soluble protective film is used as a mask in order to cause the chemical to selectively act on the processed region of the workpiece, for example. However, the water-soluble protective film has little resistance against the chemical. Therefore, if the workpiece is treated with use of this water-soluble protective film, the protective film is lost in the middle and the chemical acts on also the region that should be protected in the workpiece.

It is also conceivable that a water-insoluble protective film is made on a front surface of the workpiece and is used as the mask in the etching. In this case, after the chemical is caused to act on the workpiece, the water-insoluble protective film is removed from the front surface of the workpiece by using an organic solvent. However, in this method, residuals of the protective film and so forth are readily left on the front surface of the workpiece.

Thus, an object of the present invention is to provide a new processing method of a workpiece that can solve problems attributed to a protective film and properly process the workpiece.

In accordance with an aspect of the present invention, there is provided a processing method of a workpiece. The processing method includes forming a protective film including a water-insoluble resin on a front surface of the workpiece, processing the workpiece on which the protective film is formed, deteriorating the protective film by supplying an organic solvent to the workpiece processed, and removing the protective film from the front surface of the workpiece by supplying cleaning water to the protective film deteriorated.

In the above-described aspect of the present invention, it is preferable that, in the deteriorating the protective film, the organic solvent be supplied to a central part of the workpiece while the workpiece is rotated to cover the whole of the workpiece by the organic solvent and, in the removing the protective film from the front surface of the workpiece, the cleaning water be supplied to the side of the front surface of the workpiece to remove the protective film.

Furthermore, in the above-described aspect of the present invention, the organic solvent includes isopropyl alcohol in some cases.

Moreover, in the above-described aspect of the present invention, in the processing the workpiece on which the protective film is formed, the side of the front surface of the workpiece may be irradiated with a laser beam with such a wavelength as to be absorbed by the workpiece and a processing mark obtained by partial removal of the workpiece may be formed.

Furthermore, in the above-described aspect of the present invention, in the processing the workpiece on which the protective film is formed, the workpiece may be thinned by grinding a back surface of the workpiece while holding the side of the front surface of the workpiece by a chuck table with the intermediary of the protective film.

Moreover, in the above-described aspect of the present invention, in the processing the workpiece on which the protective film is formed, part of the workpiece may be removed by etching with use of the protective film as a mask.

In the processing method of a workpiece according to the aspect of the present invention, the protective film including the water-insoluble resin is formed on the front surface of the workpiece. Therefore, when this workpiece is processed, the front surface side of the workpiece is properly protected by the protective film. Specifically, differently from the case of using the water-soluble protective film, the situation in which the protective film is lost in the middle of the processing and the region that should be protected in the workpiece is damaged does not occur.

Moreover, in the processing method of a workpiece according to the aspect of the present invention, the protective film that has become unnecessary is deteriorated by the organic solvent and thereafter is removed by the cleaning water. Therefore, residuals of the protective film and so forth are not left on the front surface of the workpiece differently from conventional techniques. As above, according to the processing method of a workpiece in accordance with the aspect of the present invention, the problems attributed to the protective film can be solved and the workpiece can be properly processed.

The above and other objects, features and advantages of the present invention and the manner of realizing them will become more apparent, and the invention itself will best be understood from a study of the following description and appended claims with reference to the attached drawings showing a preferred embodiment of the invention.

DETAILED DESCRIPTION OF THE PREFERRED EMBODIMENT

Figure 1:
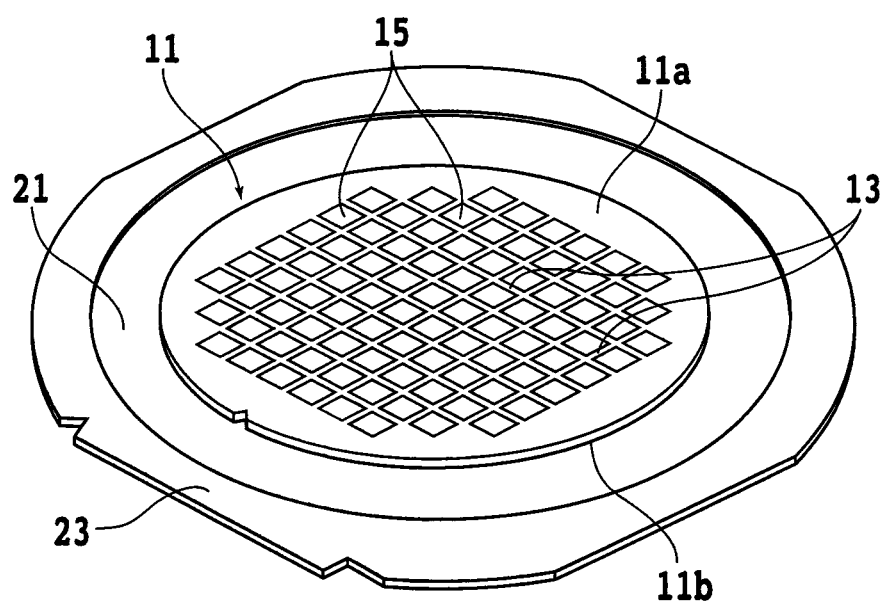
FIG. 1 is a perspective view depicting a workpiece and so forth.

An embodiment of the present invention will be described with reference to the accompanying drawings. FIG. 1 is a perspective view schematically depicting a workpiece (processing-target object) 11 and so forth processed by a processing method of a workpiece according to the present embodiment. As depicted in FIG. 1, the workpiece 11 of the present embodiment is a wafer that is composed of gallium arsenide (GaAs) and has a circular disc shape, for example, and has a front surface 11a and a back surface 11b substantially parallel to each other.

The front surface 11a of the workpiece 11 is segmented into plural regions by plural planned dividing lines (streets) 13 that intersect each other. In each of the regions marked out by these planned dividing lines 13, a device 15 such as a laser diode (LD) is formed, for example.

There is no limit on the material, shape, structure, size, and so forth of the workpiece 11. For example, it is also possible to use, as the workpiece 11, a wafer with a circular disc shape or a substrate with a rectangular shape in plan view composed of a semiconductor such as silicon (Si), indium phosphide (InP), gallium nitride (GaN), or silicon carbide (SiC), a dielectric (insulator) such as sapphire ($Al_2O_3$), soda glass, borosilicate glass, or quartz glass, or a ferroelectric such as lithium tantalate ($LiTaO_3$) or lithium niobate ($LiNbO_3$).

Similarly, there is no limit also on the kind, quantity, shape, structure, size, placement, and so forth of the device 15. For example, as the device 15, an integrated circuit (IC), micro electro mechanical systems (MEMS), light emitting diode (LED), photodiode, surface acoustic wave (SAW) filter, bulk acoustic wave (BAW) filter, or the like may be formed. Furthermore, the devices 15 do not have to be formed in the workpiece 11.

In the processing method of a workpiece according to the present embodiment, first, a dicing tape 21 with a larger size than the workpiece 11 is stuck to the back surface 11b of this workpiece 11 (dicing tape sticking step). Typically the dicing tape 21 includes a film-shaped base and a glue layer made on one surface of the base.

The base of the dicing tape 21 is composed of a material such as polyolefin, vinyl chloride, or polyethylene terephthalate, for example, and the glue layer of the dicing tape 21 is composed of an acrylic-based or rubber-based material, for example. When the glue layer side of this dicing tape 21 is brought into tight contact with the back surface 11b of the workpiece 11, the dicing tape 21 is stuck to the workpiece 11.

A ring-shaped frame 23 composed of a metal material such as stainless steel (SUS) or aluminum, for example, is fixed to the peripheral part of the glue layer side of the dicing tape 21. Thereby, the workpiece 11 is supported by the ring-shaped frame 23 with the intermediary of the dicing tape 21. It is also possible to process the workpiece 11 without using the dicing tape 21 and the frame 23 as described later.

Figure 2:
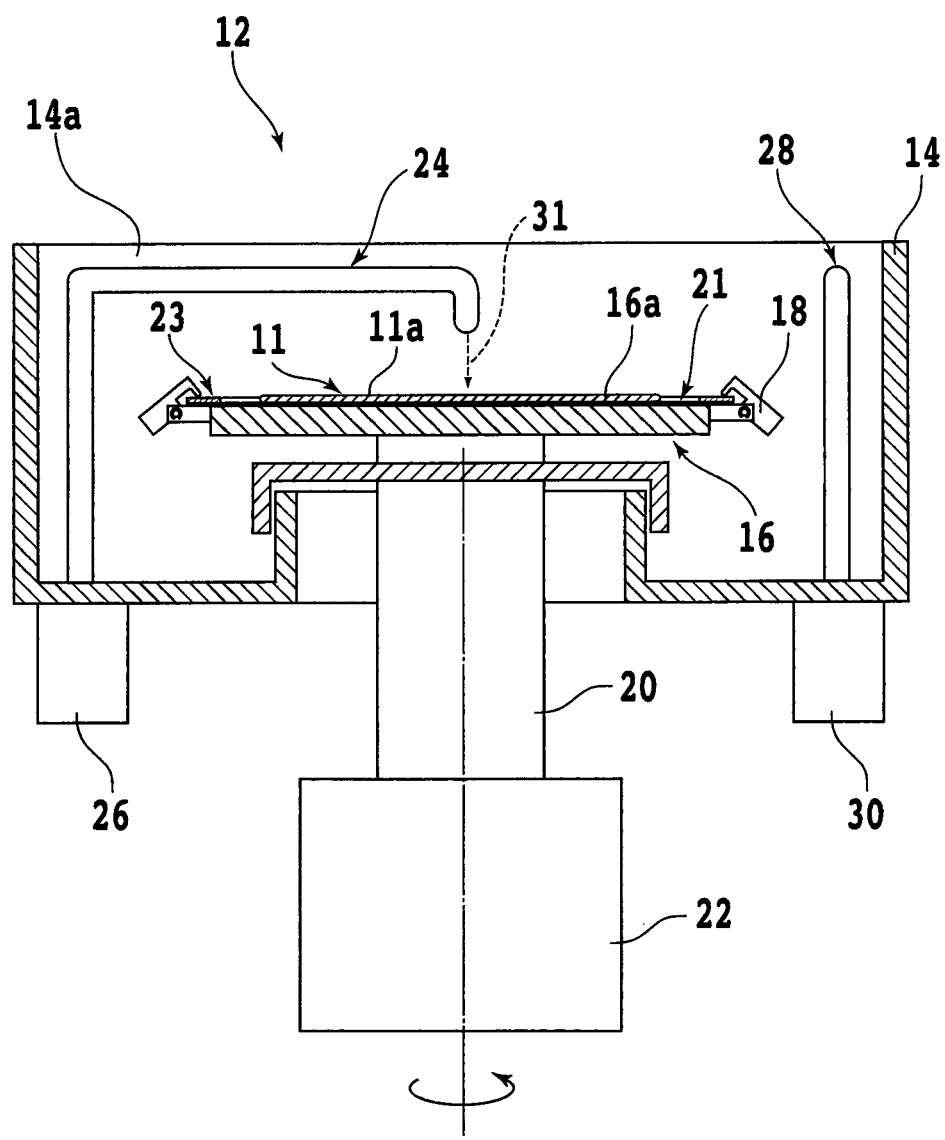
FIG. 2 is a partial sectional side view depicting how a protective film is formed on the workpiece.

After the dicing tape 21 is stuck to the workpiece 11, a protective film composed of a water-insoluble resin is formed on the front surface 11a of the workpiece 11 (protective film forming step). FIG. 2 is a partial sectional side view depicting how the protective film is formed on the workpiece. For the forming of the protective film, a spin coater 12 depicted in FIG. 2 is used, for example.

The spin coater 12 includes a circular cylindrical housing part 14 in which the workpiece 11 and so forth are housed. A space 14a inside this housing part 14 serves as a treatment chamber when the protective film is formed for the workpiece 11. A spinner table 16 is disposed near the center of the space 14a.

Part of the upper surface of the spinner table 16 is a holding surface 16a that holds the workpiece 11 (dicing tape 21). A suction source (not depicted) such as an ejector is connected to the holding surface 16a through a flow path (not depicted) formed inside the spinner table 16, a valve (not depicted), and so forth. Therefore, a negative pressure of the suction source acts on the holding surface 16a when the valve is opened.

Plural clamps 18 that fix the above-described ring-shaped frame 23 are disposed around the spinner table 16. Furthermore, a rotational drive source 22 such as a motor is coupled to the lower part of the spinner table 16 with the intermediary of a spindle 20. The spinner table 16 rotates by a force generated by this rotational drive source 22.

Each clamp 18 is capable of fixing the frame 23 by using a centrifugal force generated due to the rotation of the spinner table 16, for example. For this reason, even when the spinner table 16 is rotated at high speed, the workpiece 11, the frame 23, and so forth do not drop off from the spinner table 16.

A first nozzle 24 that drops a liquid raw material 31 used for the forming of the protective film from the tip part is disposed above the spinner table 16. A rotational drive source 26 such as a motor is coupled to the base end side of the first nozzle 24 and the tip part of the first nozzle 24 that drops the liquid raw material 31 moves in a region above the spinner table 16 by a force generated by this rotational drive source 26.

In the present embodiment, the first nozzle 24 is rotated around a rotation axis along the vertical direction by the force of the rotational drive source 26. Thus, the movement path of the tip part of the first nozzle 24 located at a position distant from this rotation axis becomes a circular arc shape. When the liquid raw material 31 is dropped, the tip part of the first nozzle 24 is moved from a first nozzle evacuation region equivalent to an end part of the space 14a to a drop region equivalent to a region directly above the spinner table 16.

Furthermore, a second nozzle 28 that supplies a fluid for cleaning from the tip part is disposed above the spinner table 16. A rotational drive source 30 such as a motor is coupled to the base end side of the second nozzle 28 and the tip part of the second nozzle 28 that supplies the fluid for cleaning moves in a region above the spinner table 16 by a force generated by this rotational drive source 30.

In the present embodiment, the second nozzle 28 is rotated around a rotation axis along the vertical direction by the force of the rotational drive source 30. Thus, the movement path of the tip part of the second nozzle 28 located at a position distant from this rotation axis becomes a circular arc shape. When the fluid for cleaning is supplied, the tip part of the second nozzle 28 is moved from a second nozzle evacuation region equivalent to an end part of the space 14a to a cleaning region equivalent to a region directly above the spinner table 16.

When the protective film is formed, first, the workpiece 11 and so forth are placed on the spinner table 16 in such a manner that the base side of the dicing tape 21 stuck to the workpiece 11 gets contact with the holding surface 16a of the spinner table 16. Then, a negative pressure of the suction source is caused to act on the holding surface 16a. As a result, the dicing tape 21 is sucked by the holding surface 16a and the workpiece 11 is held by the spinner table 16 with the intermediary of this dicing tape 21. That is, the side of the front surface 11a of the workpiece 11 is exposed upward.

Thereafter, the tip part of the first nozzle 24 is moved to the drop region equivalent to the region directly above the spinner table 16 and the liquid raw material 31 is dropped from this tip part toward the side of the front surface 11a of the workpiece 11 held by the spinner table 16. Specifically, the tip part of the first nozzle 24 is positioned above the central part of the workpiece 11 and the liquid raw material 31 is dropped.

In addition, the spinner table 16 is rotated. The rotation speed of the spinner table 16 is 2000 rpm, for example, and the time for which the spinner table 16 is rotated is 30 seconds, for example. However, there is no particular limitation on the condition relating to the rotation and so forth of the spinner table 16. Due to this rotation of the spinner table 16, the liquid raw material 31 spreads over the whole of the front surface 11a of the workpiece 11. That is, the liquid raw material 31 is applied over the whole of the front surface 11a.

In the present embodiment, as the liquid raw material 31, polyvinyl butyral (PVB) suitable for the forming of the protective film composed of the water-insoluble resin is used. An acrylic-based resin typified by a polymethyl methacrylate resin, a cellulose-based resin including cellulose acetate, an epoxy-based resin, or the like may be used as the liquid raw material 31.

After the liquid raw material 31 is spread over the whole of the front surface 11a of the workpiece 11, this liquid raw material 31 is dried at room temperature, for example. The time for which the liquid raw material 31 is dried (time for which the workpiece 11 is left to stand at room temperature) is 24 hours, for example. Thereby, a protective film 33 (see FIG. 3) composed of the water-insoluble resin is formed on the front surface 11a of the workpiece 11. However, there is no particular limitation on the condition when the liquid raw material 31 applied on the front surface 11a of the workpiece 11 is dried.

For example, it is also possible to dry the liquid raw material 31 applied on the front surface 11a of the workpiece 11 by continuing to rotate the spinner table 16 in the state in which the supply of the liquid raw material 31 is stopped. Furthermore, the liquid raw material 31 may be heated by using a hot plate, oven (drying furnace), heater, lamp, or the like and be dried in a short time. For example, the liquid raw material 31 can be dried in a short time by loading the workpiece 11 into an oven set at 80° C. In this case, it suffices for the time of the heating to be approximately three minutes, for example.

Figure 3:
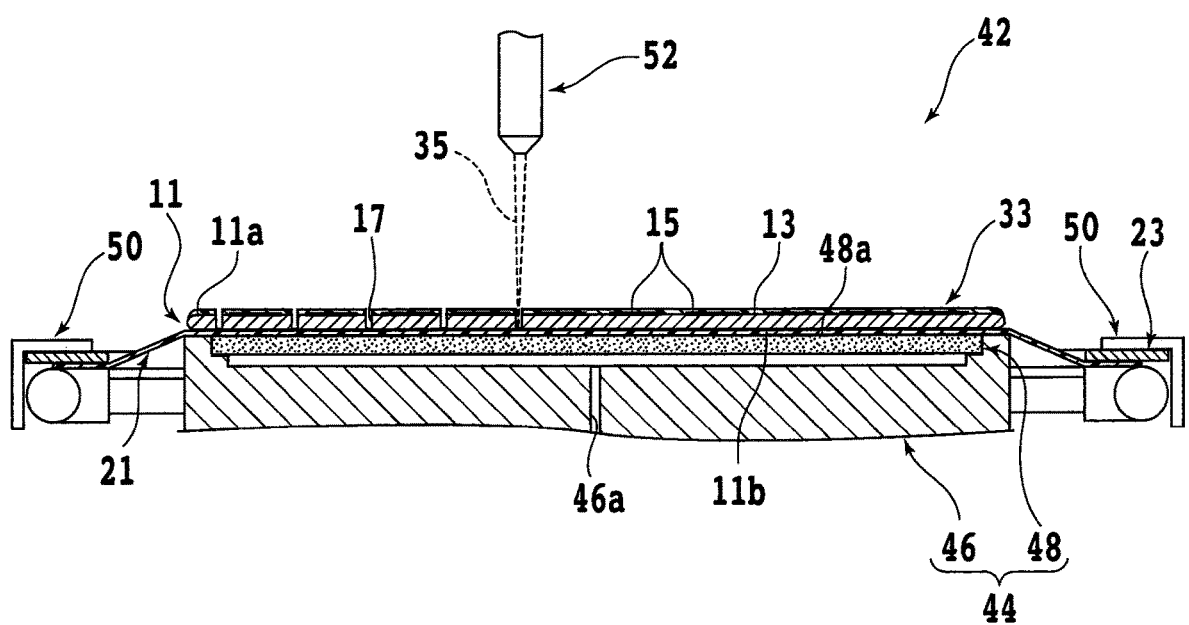
FIG. 3 is a partial sectional side view depicting how the workpiece is processed by a laser beam.

After the water-insoluble protective film 33 is formed on the front surface 11a of the workpiece 11, the side of the front surface 11a of the workpiece 11 is irradiated with a laser beam with such a wavelength as to be absorbed by the workpiece 11 and the workpiece 11 is processed (processing step, laser ablation step). FIG. 3 is a partial sectional side view depicting how the workpiece 11 is processed by the laser beam. When the workpiece 11 is processed by the laser beam, a laser processing apparatus 42 depicted in FIG. 3 is used, for example.

The laser processing apparatus 42 includes a chuck table 44 used for holding of the workpiece 11. For example, the chuck table 44 includes a circular cylindrical frame body 46 composed of a metal material typified by stainless steel and a holding plate 48 that is composed of a porous material and is disposed on the upper part of the frame body 46.

The upper surface of the holding plate 48 serves as a holding surface 48a that holds the workpiece 11 (dicing tape 21). The lower surface side of the holding plate 48 is connected to a suction source (not depicted) through a flow path 46a made inside the frame body 46, a valve (not depicted), and so forth. Therefore, a negative pressure of the suction source acts on the holding surface 48a when the valve is opened.

Plural clamps 50 used for fixing of the frame 23 are disposed around the frame body 46. The frame body 46 (chuck table 44) is coupled to a rotational drive source (not depicted) such as a motor and rotates around a rotation axis substantially perpendicular to the above-described holding surface 48a. Furthermore, the frame body 46 (chuck table 44) is supported by a movement mechanism (not depicted) and moves in a direction substantially parallel to the above-described holding surface 48a.

A laser irradiation unit 52 is disposed above the chuck table 44. The laser irradiation unit 52 emits a laser beam 35 pulse-oscillated by a laser oscillator (not depicted) to a predetermined position and focuses the laser beam 35. The laser oscillator used in the present embodiment is capable of generating the laser beam 35 with such a wavelength as to be absorbed by the workpiece 11 (such a wavelength as to be readily absorbed) and is suitable for laser ablation of the workpiece 11.

As described above, the workpiece 11 is composed of gallium arsenide. Therefore, in the present embodiment, a laser oscillator that can generate the laser beam 35 with a wavelength of 355 nm to 532 nm is used. As such a laser oscillator, a laser oscillator using a crystal of Nd:YAG, Nd:YVO4, or the like is cited, for example.

When the workpiece 11 is processed, first, the base side of the dicing tape 21 stuck to the workpiece 11 is brought into contact with the holding surface 48a of the chuck table 44 and then a negative pressure of the suction source is caused to act on the holding surface 48a. As a result, the dicing tape 21 is sucked by the holding surface 48a and the workpiece 11 is held by the chuck table 44 in the state in which the protective film 33 on the side of the front surface 11a is exposed upward. The frame 23 is fixed by the clamps 50.

Next, the position of the chuck table 44 and so forth are adjusted and, for example, the position of the laser irradiation unit 52 is aligned with the upper side of an extended line of the arbitrary planned dividing line 13. Then, as depicted in FIG. 3, while the laser beam 35 is emitted from the laser irradiation unit 52 toward the side of the front surface 11a of the workpiece 11, the chuck table 44 is moved in the direction parallel to the planned dividing line 13 of the target. That is, the workpiece 11 is irradiated with the laser beam 35 along the planned dividing line 13 of the target.

The irradiation with the laser beam 35 is carried out with a condition under which the laser beam 35 is focused on the front surface 11a of the workpiece 11 or inside the workpiece 11, for example. By irradiating the workpiece 11 with the laser beam 35 with such a wavelength as to be absorbed by the workpiece 11 along the planned dividing line 13 as above, the workpiece 11 and the protective film 33 can be partly removed along the planned dividing line 13 and a processing mark 17 can be formed. That is, the processing mark 17 by the laser ablation can be formed in the workpiece 11 along the planned dividing line 13.

In the present embodiment, the irradiation with the laser beam 35 is carried out with a condition under which the processing mark 17 that splits the workpiece 11 along the planned dividing line 13 can be formed. Specifically, the irradiation of the planned dividing line 13 of the target (first planned dividing line) with the laser beam 35 is repeated several times until the workpiece 11 is split along this planned dividing line 13 (first planned dividing line).

That is, after irradiation with the laser beam 35 is carried out along the planned dividing line 13 of the target (first planned dividing line) from one end thereof to the other end, the laser beam 35 may be focused at another position different in the thickness direction and the same planned dividing line 13 (first planned dividing line) may be irradiated with the laser beam 35 again. This makes it possible to surely split the workpiece 11 along the planned dividing line 13 of the target (first planned dividing line).

However, conditions of the laser beam 35, such as the output power, the spot diameter, the repetition frequency, and the number of times of irradiation, are arbitrarily set within a range in which the workpiece 11 can be properly split. For example, irradiation with the laser beam 35 along the planned dividing line 13 of the target (first planned dividing line) does not need to be repeated several times if the workpiece 11 can be split by one time of irradiation with the laser beam 35.

After the workpiece 11 is processed along the planned dividing line 13 of the target (first planned dividing line), the position of the chuck table 44 and so forth are adjusted again and the position of the laser irradiation unit 52 is aligned with the upper side of an extended line of the different planned dividing line 13 (second planned dividing line). Then, while the laser beam 35 is emitted from the laser irradiation unit 52 toward the side of the front surface 11a of the workpiece 11, the chuck table 44 is moved in the direction parallel to this different planned dividing line 13 (second planned dividing line).

That is, the workpiece 11 is irradiated with the laser beam 35 along the different planned dividing line 13 (second planned dividing line). As a result, the processing mark 17 is formed in the workpiece 11 along this different planned dividing line 13 (second planned dividing line). The irradiation of this different planned dividing line 13 (second planned dividing line) with the laser beam 35 is carried out under a condition equivalent to that of the irradiation of the planned dividing line 13 employed as the target previously (first planned dividing line) with the laser beam 35.

The above-described procedure is repeated until the workpiece 11 is processed (split) along all planned dividing lines 13. As a result, the workpiece 11 is divided into plural device chips each including the device 15. Similarly, the protective film 33 is also divided into small protective films corresponding to the respective device chips together with the workpiece 11. Although the processing mark 17 in the form of splitting the workpiece 11 is formed in the present embodiment, this processing mark 17 may be a groove or the like that does not split the workpiece 11.

Figure 4:
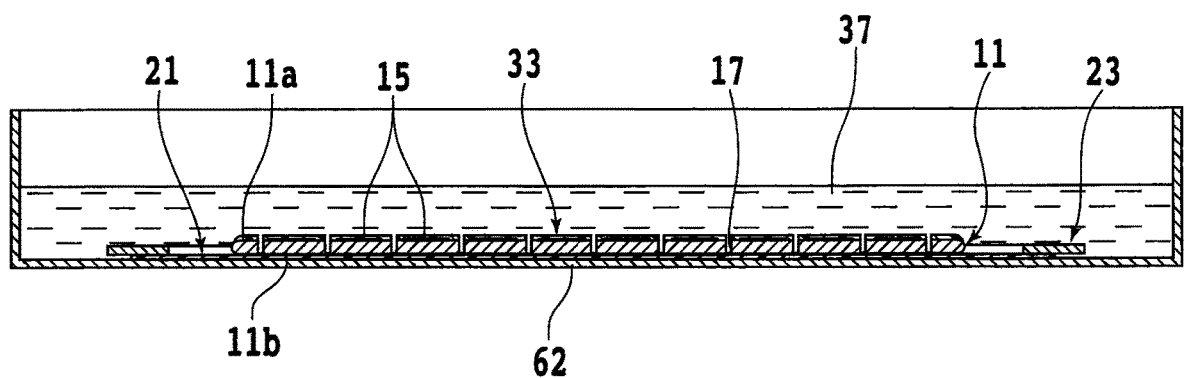
FIG. 4 is a partial sectional side view depicting how part of the workpiece is removed by wet etching.

After the workpiece 11 is processed through the irradiation with the laser beam 35, part of the workpiece 11 is removed by wet etching with use of the protective film 33 as the mask (processing step, wet etching step). FIG. 4 is a partial sectional side view depicting how part of the workpiece 11 is removed by the wet etching.

When part of the workpiece 11 is removed by the wet etching, the workpiece 11 is immersed in an etchant 37 poured into an etching tank 62 as depicted in FIG. 4. In the present embodiment, the dicing tape 21 and the frame 23 are also immersed in the etchant 37 together with the workpiece 11.

As the etchant 37, for example, an alkaline aqueous solution obtained by dissolving ammonium hydroxide ($NH_4OH$) and hydrogen peroxide ($H_2O_2$) into water ($H_2O$) can be used. In this case, it is preferable to immerse the workpiece 11 in the etchant 37 for approximately two minutes, for example. However, conditions such as the kind of etchant 37 and the time of the treatment are arbitrarily set according to conditions such as the kind and thickness of the workpiece 11.

For example, it is also possible to use, as the etchant 37, an alkaline aqueous solution obtained by dissolving potassium hydroxide (KOH), sodium hydroxide (NaOH), tetramethylammonium hydroxide (TMAH), or the like into water. Furthermore, an acid aqueous solution (hydrochloric acid) obtained by dissolving hydrogen chloride (HCl) into water, a mixed acid of phosphoric acid ($H_3PO_4$) and sulfuric acid ($H_2SO_4$), or the like may be used as the etchant 37.

As described above, the side of the front surface 11a of the workpiece 11 is covered by the protective film 33 composed of the water-insoluble resin except for the regions corresponding to the processing marks 17. Thus, when the workpiece 11 is immersed in the etchant 37, the etchant acts on only the regions that are not covered by this protective film 33.

That is, in this wet etching, the partial regions that are not covered by the protective film 33 are removed from the workpiece 11. Due to this, for example, processing distortion (heat distortion) and so forth caused in the vicinities of the processing marks 17 can be removed from the workpiece 11 and the flexural strength of the device chips can be enhanced.

Furthermore, in the present embodiment, the protective film 33 composed of the water-insoluble resin is used as the mask in the wet etching as described above. Therefore, the mask is not dissolved and lost due to the etchant differently from the case of using a protective film composed of a water-soluble resin as the mask. Thus, the regions that should be protected in the workpiece 11 (devices 15, for example) can be surely protected.

Figure 5:
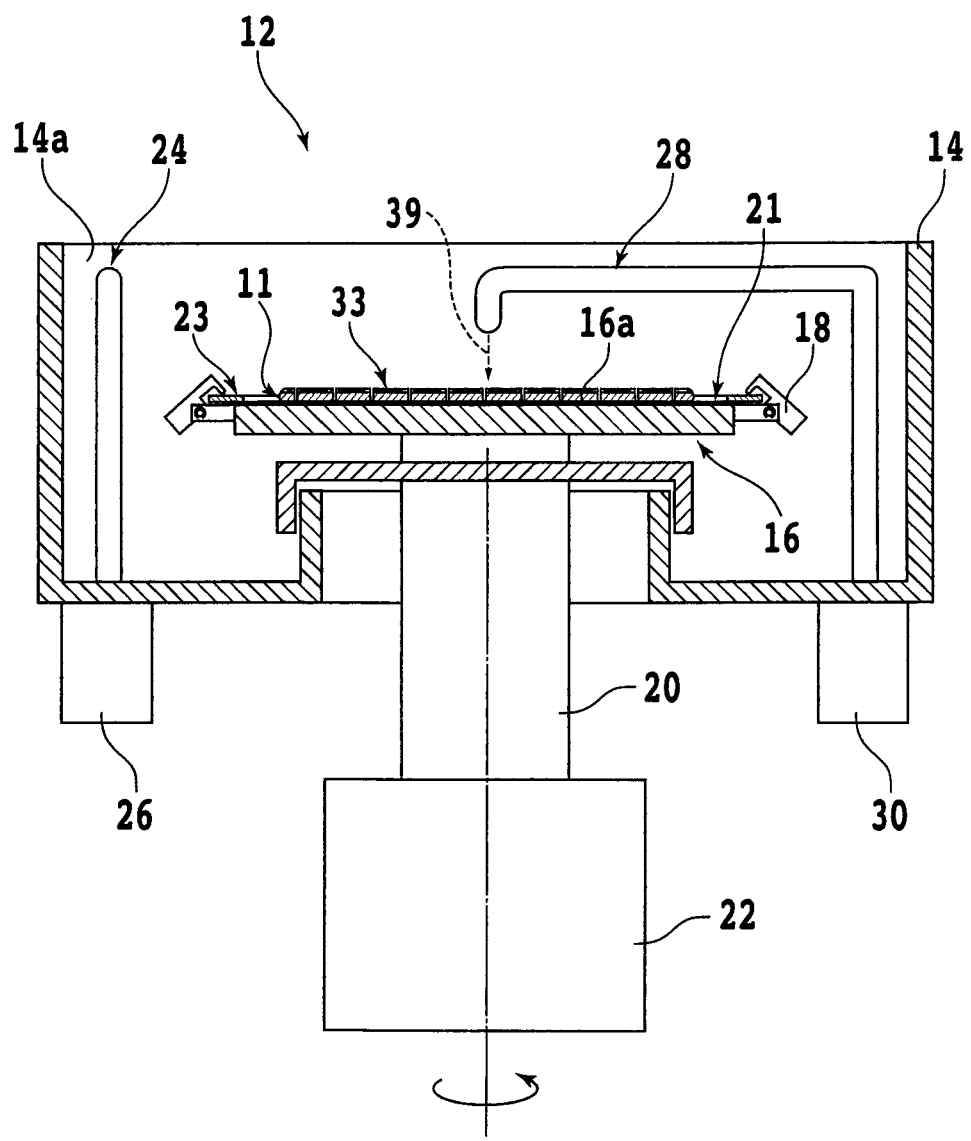
FIG. 5 is a partial sectional side view depicting how an etchant used in the wet etching is rinsed off.

After part of the workpiece 11 is removed by the wet etching, the etchant 37 that adheres to the workpiece 11 and so forth is rinsed off (rinse step). FIG. 5 is a partial sectional side view depicting how the etchant 37 used in the wet etching is rinsed off. When the etchant 37 is rinsed off, the above-described spin coater 12 is used, for example.

Specifically, first, the workpiece 11 and so forth are placed on the spinner table 16 in such a manner that the base side of the dicing tape 21 stuck to the workpiece 11 gets contact with the holding surface 16a of the spinner table 16. Then, a negative pressure of the suction source is caused to act on the holding surface 16a. As a result, the dicing tape 21 is sucked by the holding surface 16a and the workpiece 11 is held by the spinner table 16 with the intermediary of this dicing tape 21. That is, the protective film 33 on the side of the front surface 11a of the workpiece 11 is exposed upward.

Thereafter, the tip part of the second nozzle 28 is moved to the cleaning region equivalent to the region directly above the spinner table 16 and a fluid 39 for cleaning is supplied from this tip part toward the workpiece 11 (protective film 33) held by the spinner table 16. In addition, the spinner table 16 is rotated at a rotation speed of 800 rpm, for example.

Water (purified water, typically) or the like is used as the fluid 39 for cleaning. For example, by carrying out this treatment for approximately five minutes, the etchant 37 that adheres to the workpiece 11 and so forth can be completely rinsed off. However, there is no particular limitation on conditions such as the rotation speed of the spinner table 16, the time of the treatment, and the kind of fluid 39 for cleaning. Furthermore, it is also possible to rinse off the etchant 37 by running water or the like, for example, without using the spin coater 12.

Figure 6:
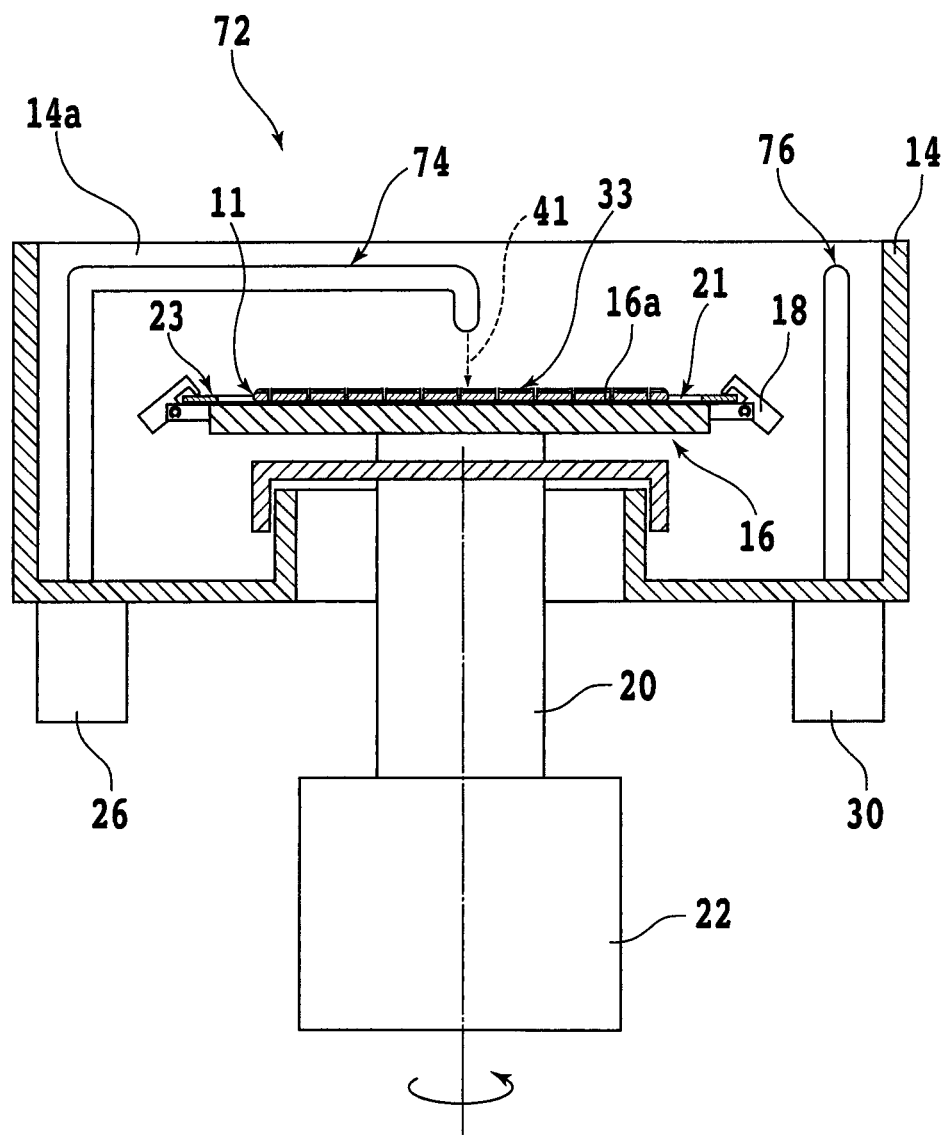
FIG. 6 is a partial sectional side view depicting how the protective film is deteriorated.
Figure 7:
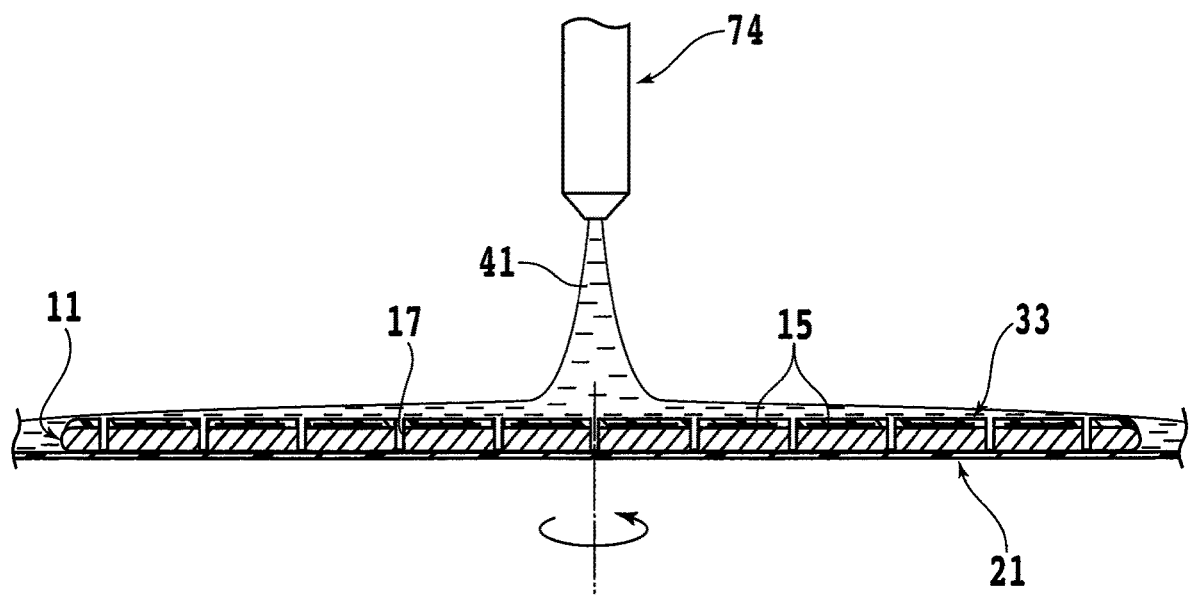
FIG. 7 is a partial sectional side view in which part of FIG. 6 is enlarged.

After the etchant 37 is rinsed off, an organic solvent is supplied to the workpiece 11 and the protective film 33 is deteriorated (deterioration step). FIG. 6 is a partial sectional side view depicting how the protective film 33 is deteriorated. FIG. 7 is a partial sectional side view in which part of FIG. 6 is enlarged. When the protective film 33 is deteriorated, a protective film removing apparatus 72 depicted in FIG. 6 is used, for example. Many constituent elements of this protective film removing apparatus 72 are common with constituent elements of the spin coater 12. Thus, the common constituent element is given the same symbol and detailed description thereof is omitted.

As depicted in FIG. 6, a first nozzle 74 that supplies an organic solvent 41 to deteriorate the protective film 33 from the tip part is disposed above the spinner table 16 forming the protective film removing apparatus 72. The rotational drive source 26 such as a motor is coupled to the base end side of the first nozzle 74 and the tip part of the first nozzle 74 that supplies the organic solvent 41 moves in a region above the spinner table 16 by a force generated by this rotational drive source 26.

In the present embodiment, the first nozzle 74 is rotated around a rotation axis along the vertical direction by the force of the rotational drive source 26. Thus, the movement path of the tip part of the first nozzle 74 located at a position distant from this rotation axis becomes a circular arc shape. When the organic solvent 41 is supplied, the tip part of the first nozzle 74 is moved from a first nozzle evacuation region equivalent to an end part of the space 14a to an organic solvent supply region equivalent to a region directly above the spinner table 16.

Furthermore, a second nozzle 76 that supplies cleaning water from the tip part is disposed above the spinner table 16. The rotational drive source 30 such as a motor is coupled to the base end side of the second nozzle 76 and the tip part of the second nozzle 76 that supplies the cleaning water moves in a region above the spinner table 16 by a force generated by this rotational drive source 30.

In the present embodiment, the second nozzle 76 is rotated around a rotation axis along the vertical direction by the force of the rotational drive source 30. Thus, the movement path of the tip part of the second nozzle 76 located at a position distant from this rotation axis becomes a circular arc shape. When the cleaning water is supplied, the tip part of the second nozzle 76 is moved from a second nozzle evacuation region equivalent to an end part of the space 14a to a cleaning water supply region equivalent to a region directly above the spinner table 16.

When the protective film 33 is deteriorated, first, the workpiece 11 and so forth are placed on the spinner table 16 in such a manner that the base side of the dicing tape 21 stuck to the workpiece 11 gets contact with the holding surface 16a of the spinner table 16. Then, a negative pressure of the suction source is caused to act on the holding surface 16a. As a result, the dicing tape 21 is sucked by the holding surface 16a and the workpiece 11 is held by the spinner table 16 with the intermediary of this dicing tape 21. That is, the protective film 33 on the side of the front surface 11a of the workpiece 11 is exposed upward.

Thereafter, the tip part of the first nozzle 74 is moved to the organic solvent supply region equivalent to the region directly above the spinner table 16 and the organic solvent 41 is supplied from this tip part toward the side of the front surface 11a (protective film 33) of the workpiece 11 held by the spinner table 16.

Specifically, the tip part of the first nozzle 74 is positioned above the central part of the workpiece 11 and the organic solvent 41 is supplied. In addition, the spinner table 16 is rotated.

In the present embodiment, isopropyl alcohol (IPA) is used as this organic solvent 41. This can deteriorate the protective film 33 without damaging the devices 15 and so forth made in the workpiece 11. In the deterioration of the protective film 33 that occurs due to the organic solvent 41, swelling, cracking (generation of cracks), partial dissolution, separation, and so forth of the protective film 33 are included.

The rotation speed of the spinner table 16 is 100 rpm to 300 rpm, for example, and the supply rate of the organic solvent 41 is 10 ml/min to 100 ml/min, for example. When the organic solvent 41 is supplied under such a condition, the side of the front surface 11a (protective film 33) of the workpiece 11 is covered by the organic solvent 41 as depicted in FIG. 7.

Specifically, if the new organic solvent 41 is continued to be supplied to the central part of the workpiece 11 and the organic solvent 41 is caused to flow from the central part of this workpiece 11 toward the peripheral part, the side of the front surface 11a of the workpiece 11 is covered by the organic solvent 41. By covering the whole of the side of the front surface 11a of the workpiece 11 by the organic solvent 41 in this manner, local drying of the workpiece 11 can be prevented and residuals attributed to the protective film 33, the organic solvent 41, and so forth can be prevented from being left on the workpiece 11.

To keep the side of the front surface 11a of the workpiece 11 covered by the organic solvent 41, it is important that the rotation speed of the spinner table 16 is not excessively increased and a sufficient amount of the organic solvent 41 according to the size (diameter) of the workpiece 11 is continued to be supplied. However, conditions such as the rotation speed of the spinner table 16 and the supply rate of the organic solvent 41 do not necessarily need to fall within the above-described ranges.

Furthermore, there is no large limitation also on the kind of organic solvent and so forth. For example, methanol, ethanol, toluene, acetone, propylene glycol monomethyl ether (PGME), or the like that can deteriorate the protective film 33 without damaging the devices 15 and so forth may be used as the organic solvent 41. Furthermore, it is also possible to use a mixed solvent typified by SOLMIX (registered trademark) as the organic solvent 41.

Figure 8:
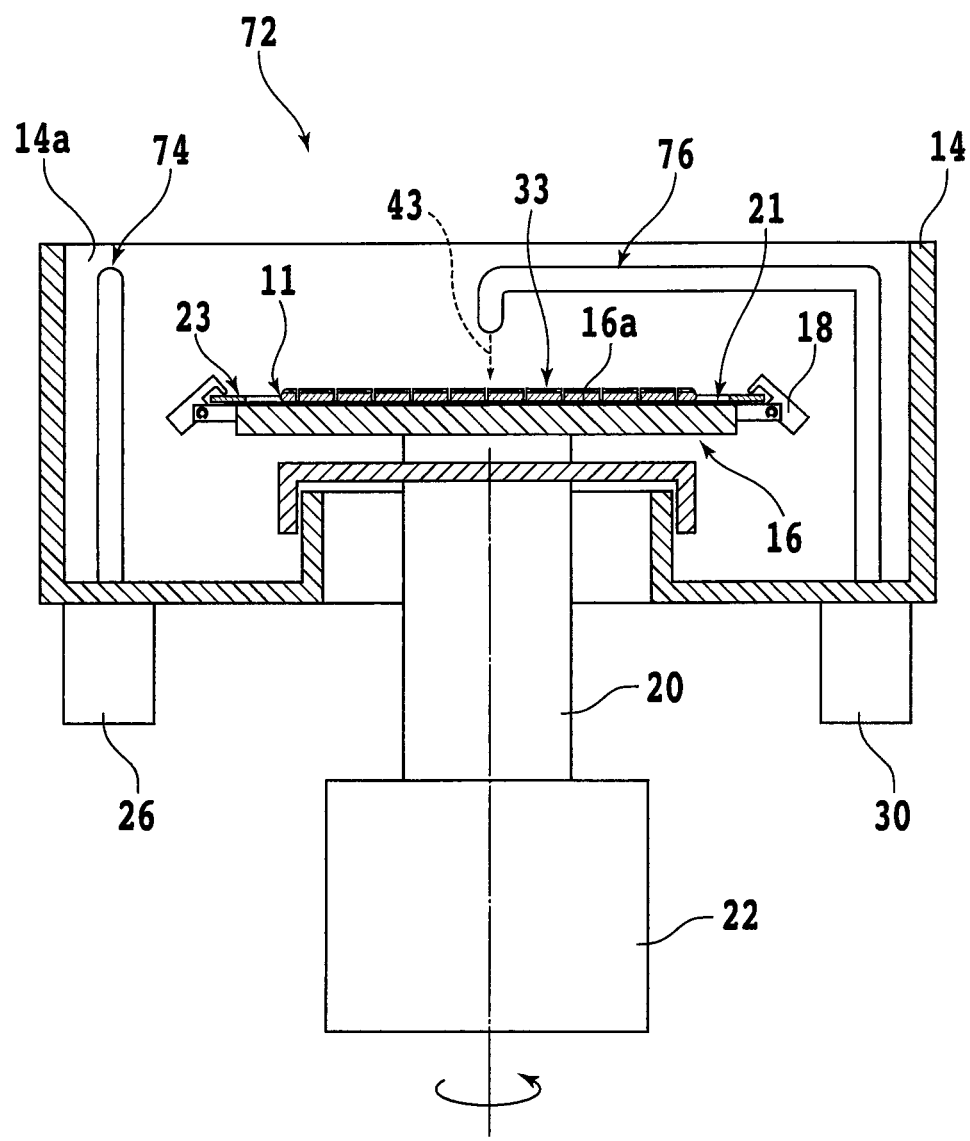
FIG. 8 is a partial sectional side view depicting how the protective film is removed from the workpiece.
Figure 9:
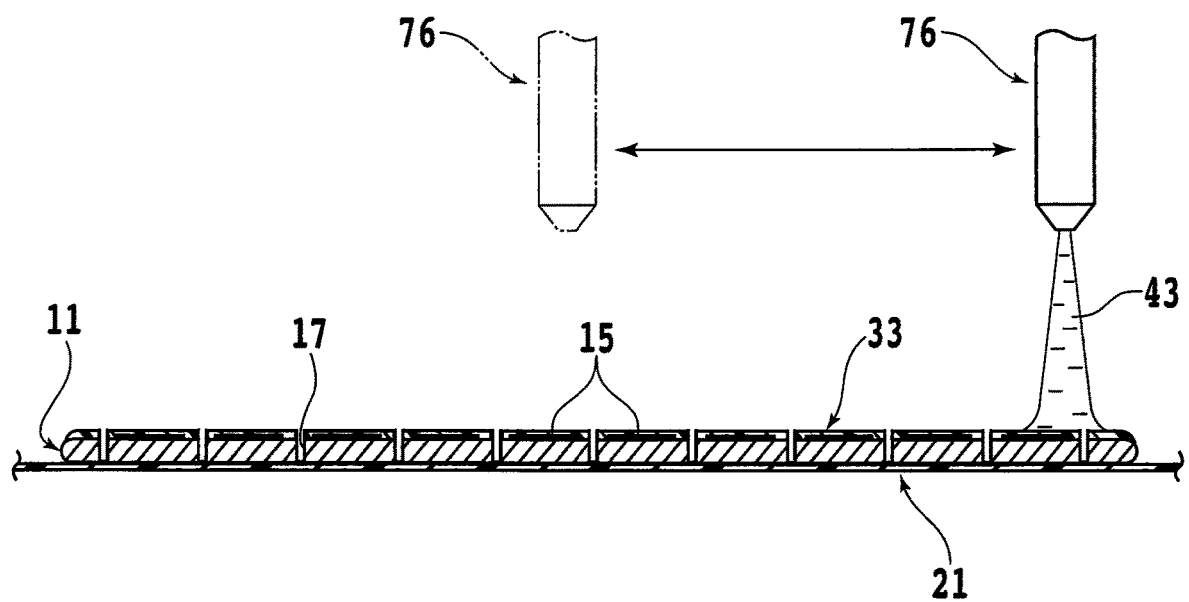
FIG. 9 is a partial sectional side view in which part of FIG. 8 is enlarged.

After the protective film 33 is deteriorated, the cleaning water is supplied to this protective film 33 and the protective film 33 is removed from the front surface 11a of the workpiece 11 (removal step). FIG. 8 is a partial sectional side view depicting how the protective film 33 is removed from the workpiece 11. FIG. 9 is a partial sectional side view in which part of FIG. 8 is enlarged. When the protective film 33 is removed, the protective film removing apparatus 72 is used consecutively.

Specifically, first, the tip part of the second nozzle 76 is moved to the cleaning water supply region equivalent to the region directly above the spinner table 16 and cleaning water 43 is supplied from this tip part toward the workpiece 11 (protective film 33) held by the spinner table 16. In addition, the spinner table 16 is rotated at a rotation speed of 800 rpm. In the present embodiment, water (purified water, typically) is used as the cleaning water 43 and it is mixed with air and is sprayed onto the workpiece 11 (protective film 33) under a condition of approximately 0.4 MPa and 200 ml/min to 400 ml/min.

As described above, the protective film 33 has deteriorated due to the organic solvent 41. For this reason, when the cleaning water 43 is sprayed onto the workpiece 11 (protective film 33) under the predetermined condition, the protective film 33 is removed from the workpiece 11 due to shock by this cleaning water 43 and so forth. Water may be used as the cleaning water 43 and be sprayed onto the workpiece 11 (protective film 33) at a high pressure of approximately 10 MPa without being mixed with air.

Furthermore, in the present embodiment, the cleaning water 43 is supplied while the second nozzle 76 is moved in the radial direction of the workpiece 11. This can spray the cleaning water 43 onto the whole of the side of the front surface 11a of the workpiece 11. Thus, the protective film 33 can be removed more surely compared with the case of supplying the cleaning water 43 without moving the second nozzle 76.

In this case, if the cleaning water 43 is sprayed onto the dicing tape 21 exposed between the workpiece 11 and the frame 23, possibly the glue layer of the dicing tape 21 that has deteriorated due to the organic solvent 41 is separated from the base and attaches to the workpiece 11. For this reason, it is desirable to move the second nozzle 76 in such a manner that the cleaning water 43 is not sprayed directly onto the dicing tape 21.

Furthermore, it is desirable that the supply of this cleaning water 43 be started in the state in which the side of the front surface 11a of the workpiece 11 is covered by the organic solvent 41. For example, after the supply of the organic solvent 41 to the workpiece 11 is stopped, the supply of the cleaning water 43 is started before the organic solvent 41 on the workpiece 11 is dried. Moreover, after the supply of the organic solvent 41 is stopped, the supply of the cleaning water 43 is started without stopping the rotation of the spinner table 16. This can prevent drying of the workpiece 11 and prevent residuals of the protective film 33 and so forth from being left on the workpiece 11.

Needless to say, the supply of the cleaning water 43 may be started before the supply of the organic solvent 41 is completely stopped. That is, the deterioration treatment (deterioration step) of the protective film 33 by the supply of the organic solvent 41 and the removal treatment (removal step) of the protective film 33 by the supply of the cleaning water 43 may be concurrently carried out. In this case, drying of the workpiece 11 can be prevented more surely. Furthermore, it is also possible to carry out the supply of the cleaning water 43 to the workpiece 11 by a method other than the so-called spin cleaning by use of the protective film removing apparatus 72 (spinner table 16).

As described above, in the processing method of a workpiece according to the present embodiment, the protective film 33 composed of water-insoluble resin is formed on the front surface 11a of the workpiece 11. Therefore, when this workpiece 11 is processed, the side of the front surface 11a of the workpiece 11 is properly protected by the protective film 33. Specifically, differently from the case of using the water-soluble protective film, the situation in which the protective film is lost in the middle of the processing and the region that should be protected in the workpiece 11 is damaged does not occur.

Furthermore, in the processing method of a workpiece according to the present embodiment, the workpiece 11 is treated with the etchant 37 after being processed by the laser beam 35. Therefore, processing distortion (heat distortion) and so forth that occur in the processing by the laser beam 35 are removed from the workpiece 11 and the quality thereof is enhanced. Moreover, the protective film 33 used in the processing by the laser beam 35 is used also for the treatment by the etchant 37. Therefore, there is also no need to prepare protective films different between the processing by the laser beam 35 and the treatment by the etchant 37.

Moreover, in the processing method of a workpiece according to the present embodiment, the protective film 33 that has become unnecessary is deteriorated by the organic solvent 41 and thereafter is removed by the cleaning water 43. Therefore, residuals of the protective film and so forth are not left on the front surface of the workpiece 11 differently from conventional techniques. As above, according to the processing method of a workpiece in accordance with the present embodiment, the problems attributed to the protective film 33 can be solved and the workpiece 11 can be properly processed.

The present invention is not limited to the description of the above-described embodiment and can be carried out with various changes. For example, in the above-described embodiment, the forming of the protective film 33 (protective film forming step) and the removal of the etchant 37 (rinse step) are carried out by a different apparatus from that for the deterioration of the protective film 33 (deterioration step) and the removal of the protective film 33 (removal step). However, these all treatments may be carried out by one apparatus. For example, these all treatments can be carried out by one spin coater 12 by adding the nozzle used for the supply of the organic solvent 41 to the spin coater 12.

Furthermore, for example, in the processing method of a workpiece according to the above-described embodiment, the protective film 33 composed of the water-insoluble resin is used for the purpose of protecting the side of the front surface 11a of the workpiece 11 in the laser ablation and the wet etching. However, it is also possible to use the protective film 33 for other purposes.

In the following, a description will be made approximately a first modification example in which the protective film 33 composed of the water-insoluble resin is used for the purpose of protecting the side of the front surface 11a of the workpiece 11 in grinding and wet etching and a second modification example in which the protective film 33 composed of the water-insoluble resin is used for the purpose of protecting the side of the front surface 11a of the workpiece 11 in plasma etching (dry etching).

In the processing method of a workpiece according to the first modification example, first, the protective film 33 composed of the water-insoluble resin is formed on the front surface 11a of the workpiece 11 in the same procedure as the above-described embodiment (protective film forming step). Here, a wafer composed of silicon is used as the workpiece 11. However, there is no limitation on the material, shape, structure, size, and so forth of the workpiece 11.

Furthermore, in this modification example, the dicing tape 21 is not stuck to the back surface 11b of the workpiece 11. Thus, when the workpiece 11 is held by the spinner table 16 of the spin coater 12, the back surface 11b of the workpiece 11 is brought into direct contact with the holding surface 16a.

If recesses and projections on the side of the front surface 11a of the workpiece 11 are large, it is preferable to form the protective film 33 by repeating application and drying of the liquid raw material 31 several times. This can form the protective film 33 that completely covers the recesses and projections on the side of the front surface 11a on the workpiece 11. This method is extremely effective when the workpiece 11 in which bumps or the like functioning as terminals (electrodes) are disposed on the side of the front surface 11a is ground, for example.

Figure 10:
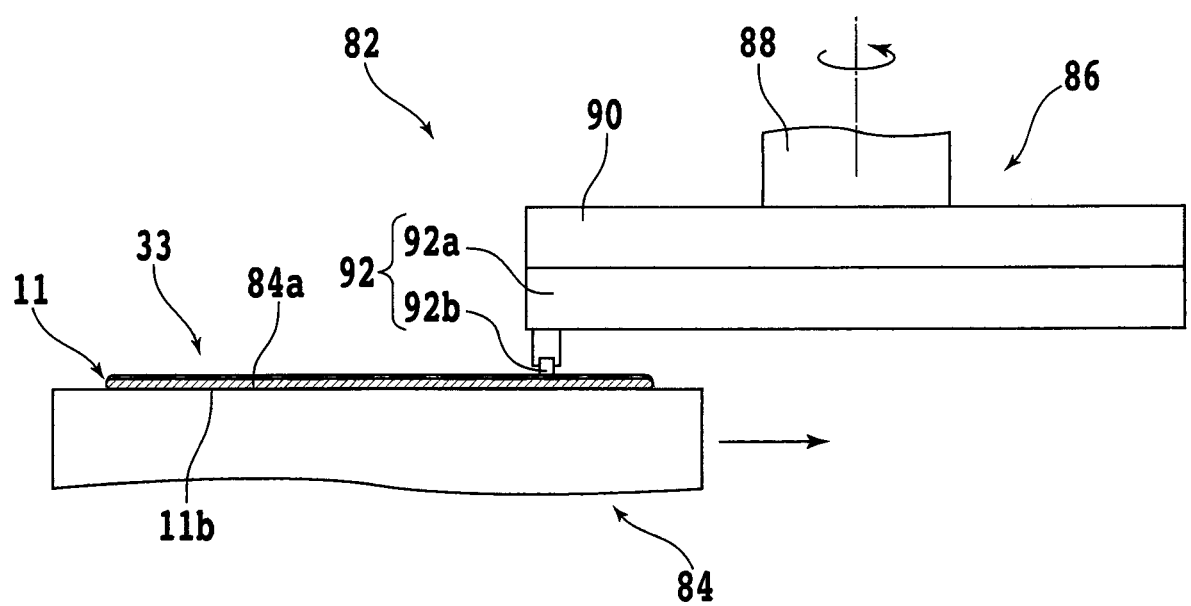
FIG. 10 is a partial sectional side view depicting how the protective film formed on the workpiece is planarized.

After the water-insoluble protective film 33 is formed on the front surface 11a of the workpiece 11, the exposed surface of this protective film 33 (surface on the opposite side to the workpiece 11) is planarized (planarization step). FIG. 10 is a partial sectional side view depicting how the protective film 33 formed on the workpiece 11 is planarized. When the protective film 33 is planarized, a turning-tool cutting apparatus 82 depicted in FIG. 10 is used, for example.

The turning-tool cutting apparatus 82 includes a chuck table 84 used for holding of the workpiece 11. The chuck table 84 is supported by a movement mechanism (not depicted) on the lower side and moves in the horizontal direction by this movement mechanism. Part of the upper surface of the chuck table 84 serves as a holding surface 84a that holds the workpiece 11. The holding surface 84a is connected to a suction source (not depicted) through a flow path (not depicted) made inside the chuck table 84, a valve (not depicted), and so forth. Therefore, a negative pressure of the suction source acts on the holding surface 84a when the valve is opened.

A turning-tool cutting unit 86 is disposed above the chuck table 84. The turning-tool cutting unit 86 includes a spindle 88. This spindle 88 is supported by a raising-lowering mechanism (not depicted) in such a manner that the axial center is parallel to the vertical direction. An instrument mount 90 having a circular disc shape with a diameter equivalent to or larger than the diameter of the workpiece 11 is fixed to the lower end part of the spindle 88.

A turning-tool instrument 92 is mounted to the lower surface of the instrument mount 90. The turning-tool instrument 92 includes a base 92a that is formed of a metal material such as aluminum or stainless steel and has a circular disc shape. A cutting edge (turning tool) 92b composed of single-crystal diamond or the like is fixed to the lower surface of the base 92a. A rotational drive source (not depicted) such as a motor is coupled to the upper end side of the spindle 88 and the turning-tool instrument 92 rotates by a force generated by the rotational drive source. Furthermore, the turning-tool instrument 92 is positioned at an arbitrary height by the raising-lowering mechanism that supports the spindle 88.

When the front surface of the protective film 33 is planarized, first, the workpiece 11 is placed on the chuck table 84 in such a manner that the back surface 11b of the workpiece 11 gets contact with the holding surface 84a of the chuck table 84. Then, a negative pressure of the suction source is caused to act on the holding surface 84a. As a result, the back surface 11b of the workpiece 11 is sucked by the holding surface 84a and the workpiece 11 is held by the chuck table 84. That is, the protective film 33 on the side of the front surface 11a of the workpiece 11 is exposed upward.

Next, the height of the turning-tool instrument 92 is adjusted by the raising-lowering mechanism in such a manner that the height of the lower end of the cutting edge 92b becomes lower than the height of the front surface (i.e., upper surface) of the protective film 33. Then, as depicted in FIG. 10, the chuck table 84 is moved in the horizontal direction while the spindle 88 (turning-tool instrument 92) is rotated.

This can cause the cutting edge 92b to cut into the front surface side of the protective film 33 along a locus of a circular arc shape and planarize the whole of the front surface side of the protective film 33. Although the protective film 33 is planarized by cutting in this first modification example, the protective film 33 may be planarized by grinding or polishing.

Figure 11:
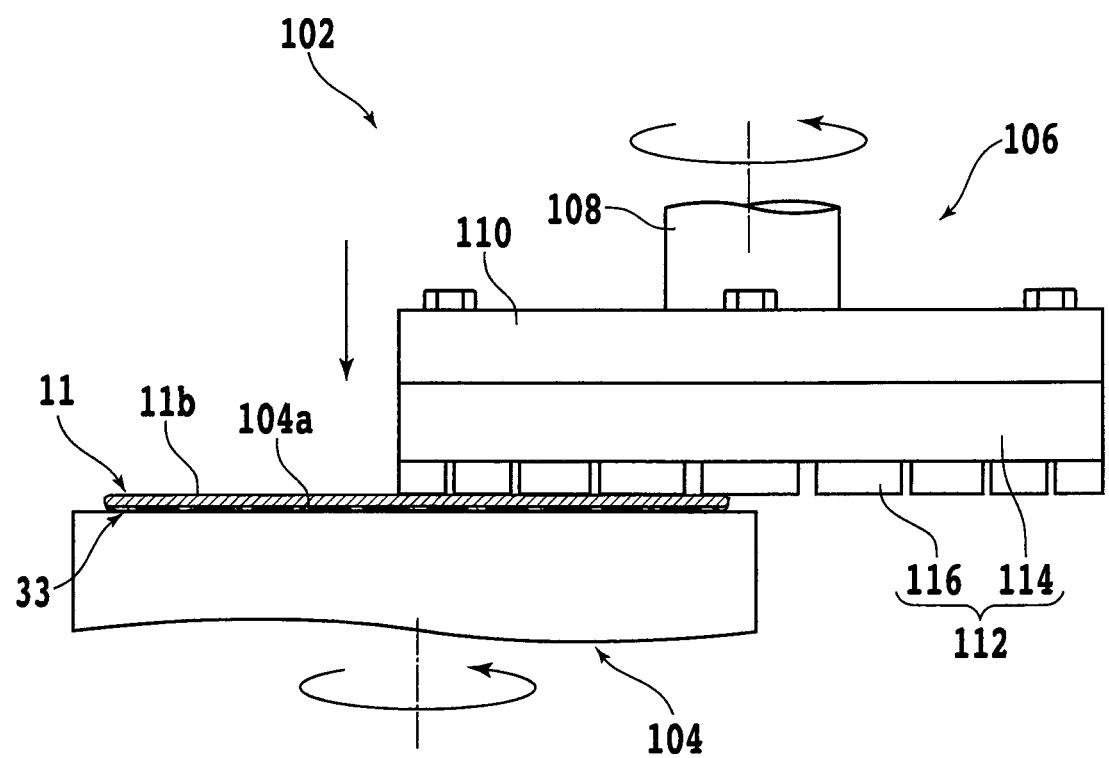
FIG. 11 is a partial sectional side view depicting how the workpiece is ground.

After the protective film 33 is planarized, the back surface 11b of the workpiece 11 is ground (processing step, grinding step). FIG. 11 is a partial sectional side view depicting how the workpiece 11 is ground. When the workpiece 11 is ground, a grinding apparatus 102 depicted in FIG. 11 is used, for example.

The grinding apparatus 102 includes a chuck table 104 used for holding of the workpiece 11. The chuck table 104 is coupled to a rotational drive source (not depicted) such as a motor and rotates around a rotation axis substantially parallel to the vertical direction by a force generated by this rotational drive source. Furthermore, the chuck table 104 is supported by a movement mechanism (not depicted) on the lower side and moves in the horizontal direction by this movement mechanism.

Part of the upper surface of the chuck table 104 serves as a holding surface 104a that holds the workpiece 11 (protective film 33). The holding surface 104a is connected to a suction source (not depicted) through a flow path (not depicted) made inside the chuck table 104, a valve (not depicted), and so forth. Therefore, a negative pressure of the suction source acts on the holding surface 104a when the valve is opened.

A grinding unit 106 is disposed above the chuck table 104. The grinding unit 106 includes a spindle 108. This spindle 108 is supported by a raising-lowering mechanism (not depicted) in such a manner that the axial center is parallel to the vertical direction. A mount 110 with a circular disc shape is fixed to the lower end part of the spindle 108.

A grinding wheel 112 having a circular disc shape with a diameter substantially equal to that of the mount 110 is mounted on the lower surface of the mount 110. The grinding wheel 112 includes a wheel base 114 formed of a metal material such as stainless steel, aluminum, or the like. Plural grinding abrasives 116 are arranged in a ring manner on the lower surface of the wheel base 114.

A rotational drive source (not depicted) such as a motor is coupled to the upper end side (base end side) of the spindle 108 and the grinding wheel 112 rotates by a force generated by this rotational drive source. A nozzle (not depicted) for supplying a liquid for grinding (grinding liquid) to the workpiece 11 and so forth is disposed at a position adjacent to the grinding unit 106 or inside the grinding unit 106.

When the back surface 11b of the workpiece 11 is ground, first, the front surface of the protective film 33 formed on the workpiece 11 is brought into contact with the holding surface 104a of the chuck table 104 and then a negative pressure of the suction source is caused to act on this holding surface 104a. As a result, the protective film 33 is sucked by the holding surface 104a and the workpiece 11 is held by the chuck table 104 in the state in which the side of the back surface 11b is exposed upward.

Next, the chuck table 104 that holds the workpiece 11 is moved to the lower side of the grinding unit 106. Then, as depicted in FIG. 11, the chuck table 104 and the spindle 108 (grinding wheel 112) are each rotated, and the spindle 108 (grinding wheel 112) is lowered while the liquid for grinding (purified water, typically) is supplied to the side of the back surface 11b of the workpiece 11.

The lowering speed (lowering amount) of the spindle 108 is adjusted in such a manner that the lower surfaces of the grinding abrasives 116 are pressed against the side of the back surface 11b of the workpiece 11 with an appropriate force. This can grind the side of the back surface 11b of the workpiece 11 and reduce the thickness of this workpiece 11. Here, the grinding is carried out until the thickness of the workpiece 11 becomes a predetermined finished thickness.

As described above, in this modification example, the side of the front surface 11a of the workpiece 11 is protected by the protective film 33 composed of the water-insoluble resin. For this reason, the protective film 33 is not dissolved in the liquid for grinding supplied to the workpiece 11. This can grind the side of the back surface 11b of the workpiece 11 while properly protecting the side of the front surface 11a by the protective film 33.

Figure 12:
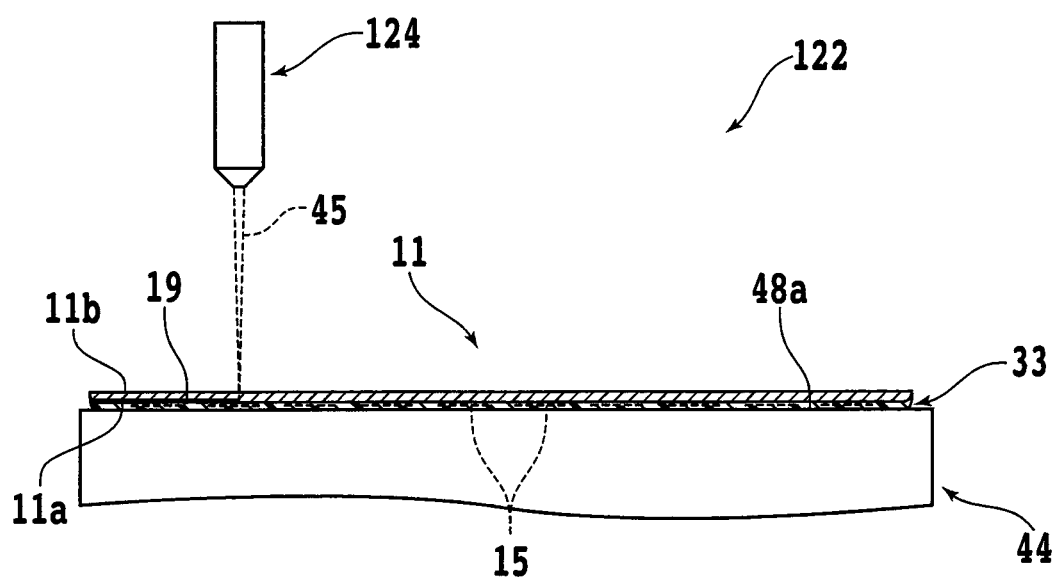
FIG. 12 is a partial sectional side view depicting how part of the workpiece is modified by a laser beam.

After the back surface 11b of the workpiece 11 is ground, for example, the workpiece 11 is irradiated with a laser beam with such a wavelength as to be transmitted through the workpiece 11 and part of the workpiece 11 is modified (processing step, modification step). FIG. 12 is a partial sectional side view depicting how part of the workpiece 11 is modified by a laser beam.

When part of the workpiece 11 is modified, a laser processing apparatus 122 depicted in FIG. 12 is used, for example. Part of constituent elements of this laser processing apparatus 122 is common with constituent elements of the laser processing apparatus 42. Thus, the common constituent element is given the same symbol and detailed description thereof is omitted.

A laser irradiation unit 124 is disposed above the chuck table 44 forming the laser processing apparatus 122. The laser irradiation unit 124 emits a laser beam 45 pulse-oscillated by a laser oscillator (not depicted) to a predetermined position and focuses the laser beam 45. The laser oscillator used in this modification example is capable of generating the laser beam 45 with such a wavelength as to be transmitted through the workpiece 11 (such a wavelength as to be hard to absorb) and is suitable for modification of the workpiece 11 by use of multi-photon absorption or the like.

In this modification example, the workpiece 11 is composed of silicon as described above. Therefore, in this modification example, a laser oscillator that can generate the laser beam 45 with a wavelength of 1064 nm to 1342 nm is used. As such a laser oscillator, a laser oscillator using a crystal of Nd:YAG, Nd:YVO4, or the like is cited, for example.

When part of the workpiece 11 is modified, first, the front surface of the protective film 33 formed on the workpiece 11 is brought into contact with the holding surface 48a of the chuck table 44 and then a negative pressure of the suction source is caused to act on this holding surface 48a. As a result, the protective film 33 is sucked by the holding surface 48a and the workpiece 11 is held by the chuck table 44 in the state in which the side of the back surface 11b is exposed upward.

Next, the position of the chuck table 44 and so forth are adjusted and, for example, the position of the laser irradiation unit 124 is aligned with the upper side of an extended line of the arbitrary planned dividing line 13. Then, as depicted in FIG. 12, while the laser beam 45 is emitted from the laser irradiation unit 124 toward the side of the back surface 11b of the workpiece 11, the chuck table 44 is moved in the direction parallel to the planned dividing line 13 of the target. That is, the workpiece 11 is irradiated with the laser beam 45 along the planned dividing line 13 of the target.

The irradiation with the laser beam 45 is carried out with a condition under which the laser beam 45 is focused inside the workpiece 11 (position of a first depth from the back surface 11b or the front surface 11a), for example. By focusing the laser beam 45 with such a wavelength as to be transmitted through the workpiece 11 inside the workpiece 11 as above, part of the workpiece 11 can be modified at the focal spot and in the vicinity thereof and a modified layer 19 with a lower strength compared with the other region can be formed. This modified layer 19 serves as the point of origin when the workpiece 11 is divided.

After the modified layer 19 is formed along the planned dividing line 13 of the target, the modified layer 19 may be formed at a position of another depth (position of a second depth) along the same planned dividing line 13 by the same procedure. However, there is no particular limitation on the number and positions of modified layers 19 formed along one planned dividing line 13.

Furthermore, it is desirable that the workpiece 11 be irradiated with the laser beam 45 with a condition under which, at the time of forming of the modified layer 19, cracks that extend from this modified layer reach the front surface 11a (or back surface 11b). Needless to say, the irradiation with the laser beam 45 may be carried out with a condition under which cracks reach both the front surface 11a and the back surface 11b. This makes it possible to divide the workpiece 11 more properly.

After the modified layer 19 is formed along the planned dividing line 13 of the target, the modified layer 19 is formed along another planned dividing line 13 by the same procedure. This procedure is repeated until the necessary number of modified layers 19 are formed along all planned dividing lines 13. In this first modification example, the modified layers 19 are formed by carrying out the irradiation with the laser beam 45 from the side of the back surface 11b of the workpiece 11. However, there is no particular limitation on the form of the irradiation with the laser beam 45.

For example, it is also possible to carry out irradiation with the laser beam 45 from the side of the front surface 11a of the workpiece 11 through the protective film 33 and form the modified layer 19 inside the workpiece 11. Furthermore, it is also possible to stick an expanding sheet to be used later to the side of the back surface 11b of the workpiece 11 and thereafter carry out irradiation with the laser beam 45 through this expanding sheet to form the modified layer 19 inside the workpiece 11.

After part of the workpiece 11 is modified, an expanding sheet 25 with a larger size than the workpiece 11 is stuck to the back surface 11b of this workpiece 11 (expanding sheet sticking step). Typically, the expanding sheet 25 includes a film-shaped base and a glue layer made on one surface of the base.

The base of the expanding sheet 25 is composed of a material such as polyolefin, vinyl chloride, or polyethylene terephthalate, for example, and the glue layer of the expanding sheet 25 is composed of an acrylic-based or rubber-based material, for example. When the glue layer side of this expanding sheet 25 is brought into tight contact with the back surface 11b of the workpiece 11, the expanding sheet 25 is stuck to the workpiece 11. A ring-shaped frame 27 composed of a metal material such as SUS or aluminum, for example, is fixed to the peripheral part of the glue layer side of the expanding sheet 25.

Figure 13A:
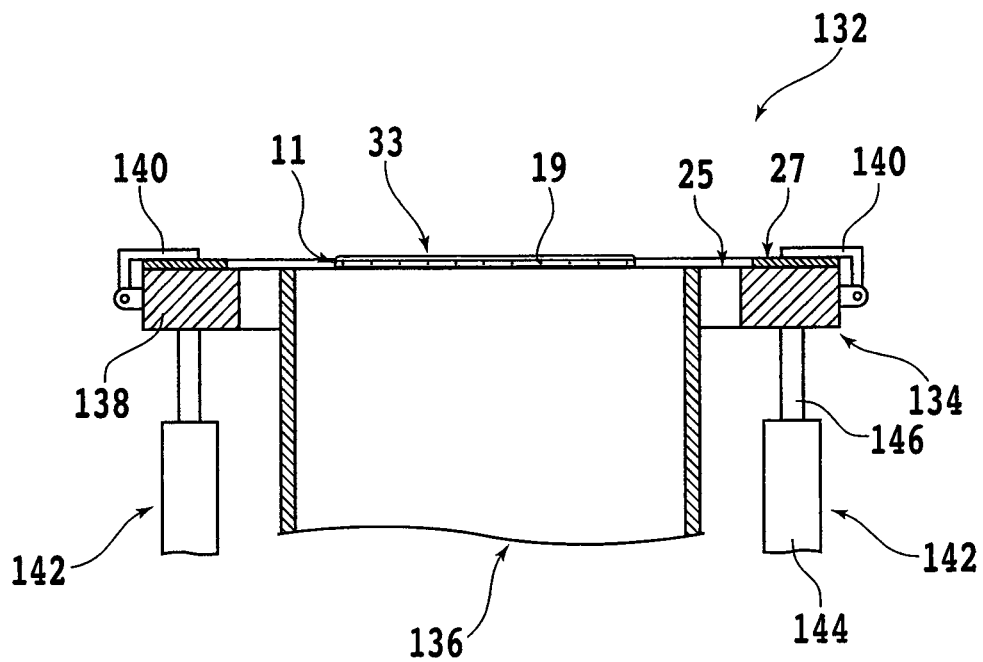
FIG. 13A and FIG. 13B are partial sectional side views depicting how an expanding sheet is expanded.
Figure 13B:
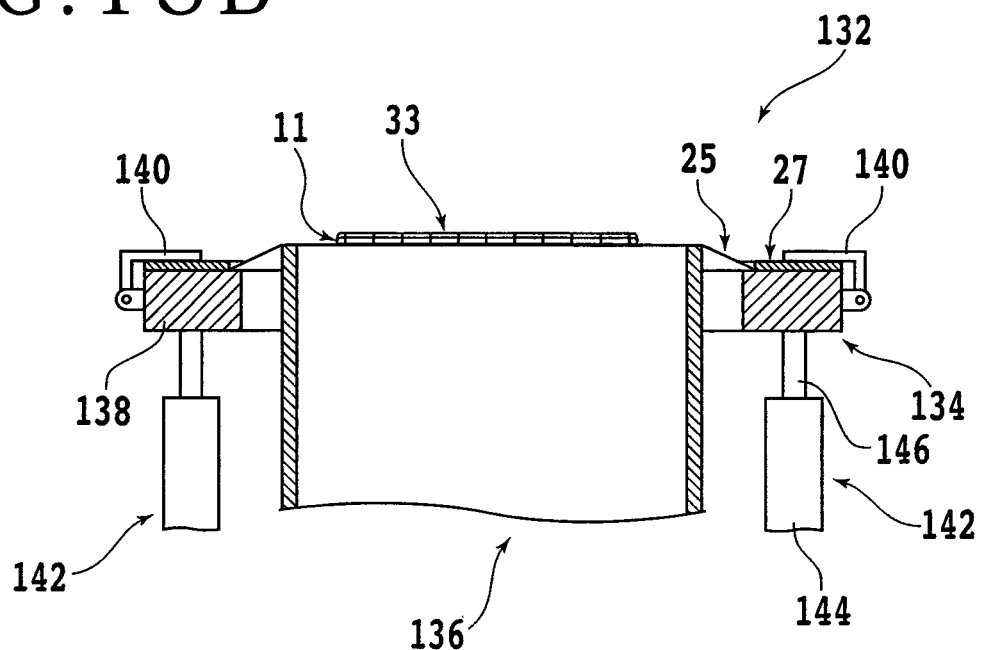

After the expanding sheet 25 is stuck to the workpiece 11, this expanding sheet 25 is expanded and the workpiece 11 is divided, with the modified layers 19 being the point of origin (expanding step). FIG. 13A and FIG. 13B are partial sectional side views depicting how the expanding sheet 25 is expanded. When the expanding sheet 25 is expanded to divide the workpiece 11, an expanding apparatus 132 depicted in FIG. 13A and FIG. 13B is used, for example.

The expanding apparatus 132 includes a support structure 134 used for support of the workpiece 11 and an expanding drum 136 with a circular cylindrical shape. The support structure 134 includes a support table 138 having an opening part with a circular shape in plan view. The ring-shaped frame 27 is placed on the upper surface of this support table 138. Plural clamps 140 for fixing the frame 27 are disposed at the outer circumferential part of the support table 138. The support table 138 is supported by a raising-lowering mechanism 142 for raising and lowering the support structure 134.

The raising-lowering mechanism 142 includes cylinder cases 144 fixed to a base (not depicted) on the lower side and piston rods 146 inserted in the cylinder cases 144. The support table 138 is fixed to the upper end parts of the piston rods 146. The raising-lowering mechanism 142 raises and lowers the support structure 134 by moving up and down the piston rods 146.

The expanding drum 136 is disposed in the opening part of the support table 138. The inner diameter (diameter) of the expanding drum 136 is larger than the diameter of the workpiece 11. Meanwhile, the outer diameter (diameter) of the expanding drum 136 is smaller than the inner diameter (diameter) of the ring-shaped frame 27 and the diameter of the opening part of the support table 138.

When the expanding sheet 25 is expanded, first, as depicted in FIG. 13A, the height of the upper surface of the support table 138 is adjusted to the height of the upper end of the expanding drum 136 and the frame 27 is placed on the upper surface of the support table 138, and thereafter the frame 27 is fixed by the clamps 140. Due to this, the upper end of the expanding drum 136 gets contact with the expanding sheet 25 between the workpiece 11 and the frame 27.

Next, the support structure 134 is lowered by the raising-lowering mechanism 142 and the upper surface of the support table 138 is moved to the lower side relative to the upper end of the expanding drum 136 as depicted in FIG. 13B. As a result, the expanding drum 136 rises up relative to the support table 138 and the expanding sheet 25 is pushed up by the expanding drum 136 to be radially expanded.

When the expanding sheet 25 is expanded, a force in such a direction as to expand the expanding sheet 25 (radial force) acts on the workpiece 11. Due to this, the workpiece 11 is divided into plural device chips, with the modified layers 19 being the point of origin. Furthermore, the protective film 33 is also divided into small protective films corresponding to the respective device chips together with the workpiece 11.

Before the expanding sheet 25 is expanded, the protective film 33 may be processed to be easy to divide through irradiation with a laser beam or the protective film 33 may be divided into small protective films by the same method. Furthermore, it is also possible to form plural protective films with a size corresponding to each device chip by using a method such as screen printing instead of the above-described method (method referred to as so-called spin coating).

After the expanding sheet 25 is expanded to divide the workpiece 11, part of the workpiece 11 is removed by wet etching with use of the protective film 33 as a mask by the same procedure as the above-described embodiment (processing step, wet etching step). Then, after part of the workpiece 11 is removed by the wet etching, the etchant 37 that adheres to the workpiece 11 and so forth is rinsed off by the same procedure as the above-described embodiment (rinse step).

Furthermore, after the etchant 37 is rinsed off, an organic solvent is supplied to the workpiece 11 and the protective film 33 is deteriorated by the same procedure as the above-described embodiment (deterioration step). Moreover, after the protective film 33 is deteriorated, cleaning water is supplied to the protective film 33 and the protective film 33 is removed from the front surface 11a of the workpiece 11 by the same procedure as the above-described embodiment (removal step).

Also in the processing method of a workpiece according to this first modification example, the protective film 33 composed of the water-insoluble resin is formed on the front surface 11a of the workpiece 11. Therefore, when this workpiece 11 is processed, the side of the front surface 11a of the workpiece is properly protected by the protective film 33. Specifically, differently from the case of using the water-soluble protective film, the situation in which the protective film is lost in the middle of the processing and the region that should be protected in the workpiece 11 is damaged does not occur.

Furthermore, in the processing method of a workpiece according to the first modification example, the workpiece 11 is modified by the laser beam 45 and then is treated with the etchant 37. Therefore, processing distortion (heat distortion) and so forth that occur in the modification by the laser beam 45 are removed from the workpiece 11 and the quality thereof is enhanced. Moreover, the protective film 33 used in the modification by the laser beam 45 is used also for the treatment by the etchant 37. Therefore, there is also no need to prepare protective films different between the modification by the laser beam 45 and the treatment by the etchant 37.

Moreover, in the processing method of a workpiece according to the first modification example, the protective film 33 that has become unnecessary is deteriorated by the organic solvent 41 and thereafter is removed by the cleaning water 43. Therefore, residuals of the protective film and so forth are not left on the front surface of the workpiece 11 differently from conventional techniques. As above, also in the processing method of a workpiece according to the first modification example, the problems attributed to the protective film 33 can be solved and the workpiece 11 can be properly processed.

In the processing method of a workpiece according to the first modification example, part of the workpiece 11 is modified and the modified layer 19 serving as the point of origin of dividing is formed. However, the processing mark 17 like that in the above-described embodiment may be formed in the workpiece 11 instead of this modified layer 19. Furthermore, it is also possible to cause a circular-ring-shaped abrasive tool called a cutting blade to cut into the workpiece 11 to form grooves serving as the point of origin of dividing in the workpiece 11 or cut the workpiece 11 and divide it into plural device chips.

In the case of cutting the workpiece 11 by using a laser beam or cutting blade, sticking of the expanding sheet 25 to this workpiece 11 and expanding of the expanding sheet 25 can be omitted. Furthermore, the wet etching with use of the protective film 33 as the mask may be omitted. In this case, it is also possible to expand the expanding sheet 25 to divide the workpiece 11 after deteriorating the protective film 33 by the organic solvent 41 and removing the protective film 33 from the workpiece 11.

Meanwhile, in the processing method of a workpiece according to the second modification example, first, the dicing tape 21 with a larger size than the workpiece 11 is stuck to the back surface 11b of the workpiece 11 by the same procedure as the above-described embodiment (dicing tape sticking step). After the dicing tape 21 is stuck to the workpiece 11, the protective film 33 composed of the water-insoluble resin is formed on the front surface 11a of the workpiece 11 by the same procedure as the above-described embodiment (protective film forming step).

However, in this second modification example, the liquid raw material 31 needs to be selected to allow forming of the protective film 33 having a certain level of resistance against dry etching (plasma etching) to be carried out later. After the water-insoluble protective film 33 is formed on the front surface 11a of the workpiece 11, for example, the protective film 33 is divided along the planned dividing lines 13 (protective film dividing step). That is, the side of the front surface 11a of the workpiece 11 is exposed along the planned dividing lines 13.

Although there is no particular limitation on the method for dividing the protective film 33, for example, the protective film 33 can be divided by a method in which the side of the front surface 11a of the workpiece 11 is irradiated with the laser beam 35 with such a wavelength as to be absorbed by the workpiece 11 along the planned dividing lines 13. In this case, grooves (processing marks) or the like are formed on the side of the front surface 11a of the workpiece 11.

Figure 14:
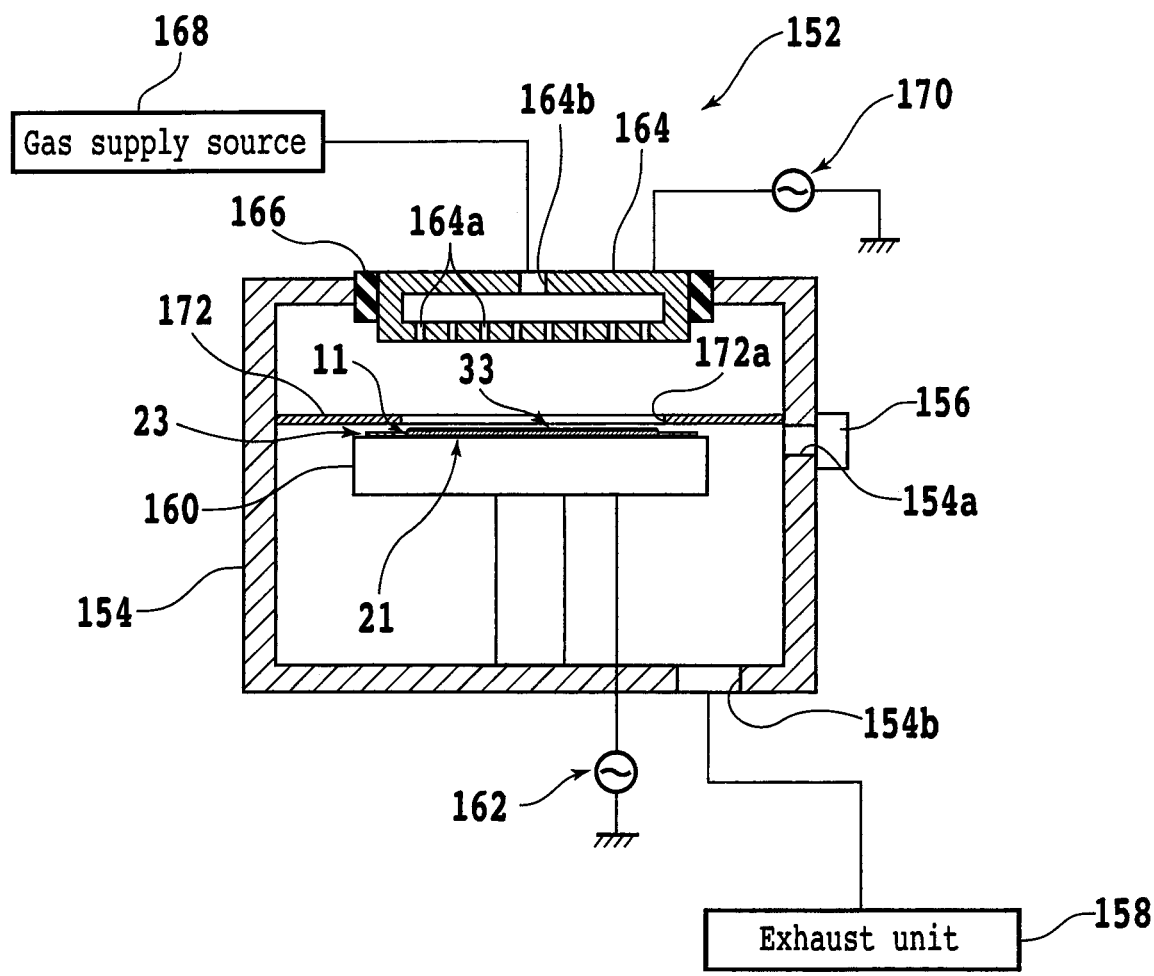
FIG. 14 is a partial sectional side view depicting how part of the workpiece is removed by plasma etching (dry etching).

After the protective film 33 is divided along the planned dividing lines 13, part of the workpiece 11 is removed by plasma etching (dry etching) (processing step, plasma etching step). FIG. 14 is a partial sectional side view depicting how part of the workpiece 11 is removed by the plasma etching. When part of the workpiece 11 is removed by the plasma etching, a plasma etching apparatus 152 depicted in FIG. 14 is used, for example.

The plasma etching apparatus 152 includes a vacuum chamber 154 inside which a space for treatment is formed. In a sidewall of the vacuum chamber 154, an opening 154a used when the workpiece 11 and so forth are carried in or out is formed. A gate 156 with such a size as to cover this opening 154a is disposed outside the opening 154a.

An opening-closing mechanism (not depicted) is coupled to the gate 156 and the gate 156 moves up and down, for example, by this opening-closing mechanism. For example, by lowering the gate 156 to expose the opening 154a, the workpiece 11 and so forth can be carried into the space inside the vacuum chamber 154 or the workpiece 11 and so forth can be carried out from the space inside the vacuum chamber 154 through the opening 154a.

An exhaust port 154b is formed in the bottom wall of the vacuum chamber 154. This exhaust port 154b is connected to an exhaust unit 158 such as a vacuum pump. A lower electrode 160 is disposed in the space of the vacuum chamber 154. The lower electrode 160 is formed into a circular disc shape by using an electrically-conductive material and is connected to a high-frequency power supply 162 outside the vacuum chamber 154.

On the upper surface side of the lower electrode 160, an electrostatic chuck (not depicted) is disposed, for example. The electrostatic chuck includes plural electrodes insulated from each other and attracts and holds the workpiece 11 by using an electrical force generated between each electrode and the workpiece 11. However, the plasma etching apparatus 152 of this modification example does not necessarily have to include the electrostatic chuck.

An upper electrode 164 formed into a circular disc shape by using an electrically-conductive material is attached to the ceiling wall of the vacuum chamber 154 with the intermediary of an insulating material 166. Plural gas ejection holes 164a are formed on the lower surface side of the upper electrode 164 and these gas ejection holes 164a are connected to a gas supply source 168 through a gas supply hole 164b or the like made on the upper surface side of the upper electrode 164. This can supply a gas for etching into the space of the vacuum chamber 154. This upper electrode 164 is also connected to a high-frequency power supply 170 outside the vacuum chamber 154.

When part of the workpiece 11 is removed by the plasma etching, first, the gate 156 is lowered by the opening-closing mechanism. Next, the workpiece 11 is carried into the space of the vacuum chamber 154 through the opening 154a and is placed on the electrostatic chuck (lower electrode 160). In this second modification example, the dicing tape 21 is stuck to the workpiece 11 and therefore the dicing tape 21 is brought into contact with the upper surface of the electrostatic chuck.

Thereafter, when the electrostatic chuck is actuated, the workpiece 11 is held by the electrostatic chuck in the state in which the protective film 33 made on the side of the front surface 11a is exposed upward. After the workpiece 11 is held by the electrostatic chuck, processing marks are formed along the planned dividing lines 13 by carrying out the plasma etching for the side of the front surface 11a of the workpiece 11 with the intermediary of the protective film 33. Specifically, first, the gate 156 is raised by the opening-closing mechanism to seal the space of the vacuum chamber 154.

Furthermore, the exhaust unit 158 is actuated to reduce the pressure in the space. In this state, while the gas for etching is supplied from the gas supply source 168 at a predetermined flow rate, appropriate high-frequency power is supplied to the lower electrode 160 and the upper electrode 164 by the high-frequency power supplies 162 and 170. Thereupon, plasma including radicals, ions, and so forth is generated between the lower electrode 160 and the upper electrode 164.

Due to this, the side of the front surface 11a of the workpiece 11 that is not covered by the protective film 33 (regions corresponding to the planned dividing lines 13) can be exposed to the plasma and the workpiece 11 can be processed. The gas for etching supplied from the gas supply source 168 is properly selected according to the material of the workpiece 11 and so forth.

There is no limitation on the concrete form of the plasma etching. For example, it is also possible to form processing marks in the workpiece 11 by using an etching technique referred to as the so-called Bosch process. In this case, for example, $SF_6$ and $O_4F_8$ are alternately supplied as the gas for etching.

In the second modification example, by this plasma etching, processing marks that split the workpiece 11 are formed along the planned dividing lines 13. As a result, the workpiece 11 is divided into plural device chips each including the device 15. Although the processing marks in the form of splitting the workpiece 11 are formed in this second modification example, the processing marks may be grooves or the like that do not split the workpiece 11.

After part of the workpiece 11 is removed by the plasma etching and the processing marks are formed, an organic solvent is supplied to the workpiece 11 and the protective film 33 is deteriorated by the same procedure as the above-described embodiment (deterioration step). Moreover, after the protective film 33 is deteriorated, cleaning water is supplied to the protective film 33 and the protective film 33 is removed from the front surface 11a of the workpiece 11 by the same procedure as the above-described embodiment (removal step).

Also in the processing method of a workpiece according to this second modification example, the protective film 33 composed of the water-insoluble resin is formed on the front surface 11a of the workpiece 11. Therefore, when this workpiece 11 is processed, the side of the front surface 11a of the workpiece is properly protected by the protective film 33. Specifically, differently from the case of using the water-soluble protective film, the situation in which the protective film is lost in the middle of the processing and the region that should be protected in the workpiece 11 is damaged does not occur.

Moreover, in the processing method of a workpiece according to the second modification example, the protective film 33 that has become unnecessary is deteriorated by the organic solvent 41 and thereafter is removed by the cleaning water 43. Therefore, residuals of the protective film and so forth are not left on the front surface of the workpiece 11 differently from conventional techniques. As above, also in the processing method of a workpiece according to the second modification example, the problems attributed to the protective film 33 can be solved and the workpiece 11 can be properly processed.

It is also possible to apply the processing of the workpiece 11 by the plasma etching according to this second modification example (plasma etching step) to the above-described embodiment and first modification example. For example, the processing of the workpiece 11 by the plasma etching (plasma etching step) may be applied instead of the processing of the workpiece 11 by the wet etching according to the above-described embodiment and first modification example (wet etching step) and so forth.

Similarly, it is also possible to apply the processing of the workpiece 11 by the plasma etching (plasma etching step) instead of the modification of the workpiece 11 according to the first modification example (modification step). In these cases, part of the procedure is properly changed according to need.

For example, in the case of applying the processing of the workpiece 11 by the plasma etching instead of the modification of the workpiece 11 according to the first modification example, after the protective film 33 composed of the water-insoluble resin is formed on the front surface 11a of the workpiece 11, the protective film 33 needs to be divided along the planned dividing lines 13 before the workpiece 11 is processed by the plasma etching.

Besides, structures, methods, and so forth according to the above-described embodiment, first modification example, and second modification example can be carried out with appropriate changes without departing from the range of the object of the present invention.

The present invention is not limited to the details of the above described preferred embodiment. The scope of the invention is defined by the appended claims and all changes and modifications as fall within the equivalence of the scope of the claims are therefore to be embraced by the invention.

What is claimed is:

1. A processing method of a workpiece, comprising:
   forming a protective film consisting essentially of a water-insoluble resin on a front surface of the workpiece, wherein the water-insoluble resin is selected from the group consisting of an acrylic-based resin, a cellulose-based resin, or an epoxy-based resin;
   processing the workpiece on which the protective film is formed;
   deteriorating the protective film by supplying an organic solvent to a central part of the processed workpiece with a solvent nozzle while rotating the workpiece to cover the whole workpiece with the organic solvent; and
   removing the protective film from the front surface of the workpiece by supplying cleaning water to the deteriorated protective film with a water nozzle, wherein the solvent nozzle is separate from the water nozzle;
   wherein the organic solvent flows from the central part toward a peripheral part of the workpiece to prevent local drying of the workpiece, wherein a flow of the cleaning water is started in a state in which the front surface of the workpiece is covered by the organic solvent.

2. The processing method of a workpiece according to claim 1, wherein the organic solvent includes isopropyl alcohol.

3. The processing method of a workpiece according to claim 1, wherein in the processing the workpiece on which the protective film is formed, a side of the front surface of the workpiece is irradiated with a laser beam with such a wavelength as to be absorbed by the workpiece and a processing mark obtained by partial removal of the workpiece is formed.

4. The processing method of a workpiece according to claim 1, wherein in the processing the workpiece on which the protective film is formed, the workpiece is thinned by grinding a back surface of the workpiece while holding a side of the front surface of the workpiece by a chuck table with intermediary of the protective film.

5. The processing method of a workpiece according to claim 1, wherein
   processing the workpiece on which the protective film is formed comprises removing part of the workpiece by etching with the protective film as a mask, wherein the etching is performed by at least one of wet etching and plasma etching.

6. The processing method of a workpiece according to claim 1, wherein the water-insoluble resin is the acrylic-based resin, or the epoxy-based resin.

7. A processing method of a workpiece comprising:
forming a protective film consisting essentially of a water-insoluble resin on a front surface of the workpiece, wherein the water-insoluble resin is polyvinyl butyral;
processing the workpiece on which the protective film is formed;
deteriorating the protective film by supplying an organic solvent to the workpiece processed; and
removing the protective film from the front surface of the workpiece by supplying cleaning water to the protective film deteriorated,
wherein the organic solvent flows from the central part toward a peripheral part of the workpiece to prevent local drying of the workpiece, wherein a flow of the cleaning water is started in a state in which the front surface of the workpiece is covered by the organic solvent.

8. The processing method of a workpiece according to claim 1, wherein in forming the protective film, the water-insoluble resin is dried by applying heat to the water-insoluble resin.

9. The processing method of a workpiece according to claim 1, wherein
processing the workpiece on which the protective film is formed comprises removing part of the workpiece by wet etching with an etchant with the protective film as a mask, wherein the etchant comprises an alkaline aqueous solution or an acid aqueous solution.

10. The processing method of a workpiece according to claim 9, wherein the acid aqueous solution comprises one or more of hydrogen chloride or a mixture of phosphoric acid and sulfuric acid dissolved into water.

11. The processing method of a workpiece according to claim 1, wherein the organic solvent comprises one or more of methanol, ethanol, toluene, acetone, or propylene glycol monomethyl ether.

12. The processing method of a workpiece according to claim 1, wherein deteriorating the protective film and removing the protective film are performed concurrently.

13. The processing method of a workpiece according to claim 1, wherein processing the workpiece on which the protective film is formed comprises removing part of the workpiece by etching, with the protective film as a mask.

14. A processing method of a workpiece, comprising:
forming a protective film consisting essentially of a water-insoluble resin on a front surface of the workpiece wherein the water-insoluble resin is selected from the group consisting of an acrylic-based resin, a cellulose-based resin, or an epoxy-based resin;
processing the workpiece on which the protective film is formed comprising removing part of the workpiece by etching with the protective film as a mask, wherein the etching is performed by at least one of wet etching and plasma etching;
deteriorating the protective film by supplying an organic solvent to the workpiece processed; and
removing the protective film from the front surface of the workpiece by supplying cleaning water to the protective film deteriorated;
wherein the organic solvent flows from the central part toward a peripheral part of the workpiece to prevent local drying of the workpiece, wherein a flow of the cleaning water is started in a state in which the front surface of the workpiece is covered by the organic solvent, wherein the flow of the cleaning water is started before a flow of the organic solvent is stopped.

15. The processing method of a workpiece according to claim 14, wherein the water-insoluble resin is the acrylic-based resin, or the epoxy-based resin, and wherein the etchant comprises an alkaline aqueous solution or an acid aqueous solution.

16. The processing method of a workpiece according to claim 1 wherein a flow of the cleaning water is started before a flow of the organic solvent is stopped.

17. The processing method of a workpiece according to claim 1 wherein a flow of the cleaning water is started while rotating the workpiece is continued.

18. The processing method of a workpiece according to claim 1 wherein the cleaning water is combined with air.

19. The processing method of a workpiece according to claim 1 wherein the water nozzle is moved radially while the cleaning water is supplied.

20. The processing method of a workpiece according to claim 1 wherein a rotation speed of the workpiece is in a range of 100 rpm to 300 rpm, and a supply rate of the organic solvent is in a range of 10 ml/min to 100 ml/min.

* * * * *